(12) United States Patent
Schiebout

(10) Patent No.: US 7,552,019 B2
(45) Date of Patent: Jun. 23, 2009

(54) SYSTEMS AND METHODS OF CONVERTING RFID LABELS

(75) Inventor: David Schiebout, Brainerd, MN (US)

(73) Assignee: Delta Industrial Services, Inc., Minneapolis, MN (US)

(*) Notice: Subject to any disclaimer, the term of this patent is extended or adjusted under 35 U.S.C. 154(b) by 201 days.

(21) Appl. No.: 11/557,688

(22) Filed: Nov. 8, 2006

(65) Prior Publication Data

US 2008/0125994 A1   May 29, 2008

(51) Int. Cl.
  *G01R 31/302* (2006.01)
(52) U.S. Cl. .................. 702/82; 702/118; 324/750
(58) Field of Classification Search .................. 702/82, 702/118; 324/750
  See application file for complete search history.

(56) References Cited

U.S. PATENT DOCUMENTS

| | | | |
|---|---|---|---|
| 6,451,154 B1 * | 9/2002 | Grabau et al. ............... | 156/300 |
| 6,857,714 B2 | 2/2005 | Hohberger et al. | |
| 6,891,110 B1 | 5/2005 | Pennaz et al. | |
| 6,899,476 B1 | 5/2005 | Barrus et al. | |
| 6,929,412 B1 | 8/2005 | Barrus et al. | |
| 6,937,153 B2 | 8/2005 | Redlin | |
| 6,942,403 B2 | 9/2005 | Hohberger et al. | |
| 6,969,134 B2 | 11/2005 | Hohberger et al. | |
| 7,037,009 B2 | 5/2006 | Barrus et al. | |
| 7,066,667 B2 | 6/2006 | Chapman et al. | |
| 2003/0062131 A1 | 4/2003 | Hohberger | |
| 2004/0215350 A1 * | 10/2004 | Roesner ........................ | 700/1 |
| 2005/0025553 A1 | 2/2005 | Hohberger et al. | |
| 2005/0139667 A1 | 6/2005 | Barrus et al. | |
| 2005/0230478 A1 | 10/2005 | Chapman et al. | |
| 2006/0012387 A1 * | 1/2006 | Shanks ........................ | 324/750 |
| 2006/0060657 A1 | 3/2006 | Choong et al. | |
| 2006/0081333 A1 | 4/2006 | Hohberger et al. | |
| 2006/0117554 A1 | 6/2006 | Herrmann et al. | |
| 2006/0145710 A1 | 7/2006 | Puleston et al. | |
| 2007/0256777 A1 * | 11/2007 | Andrews ..................... | 156/163 |
| 2008/0047660 A1 * | 2/2008 | Angel et al. ................. | 156/238 |

* cited by examiner

*Primary Examiner*—Bryan Bui
*Assistant Examiner*—Jonathan Teixeira Moffat
(74) *Attorney, Agent, or Firm*—Schwegman, Lundberg & Woessner, P.A.

(57) ABSTRACT

Various method embodiments comprise testing a plurality of RFID tags forming at least a portion of a first web to identify defective RFID tags and verified RFID tags, cutting the first web between a rotary die and an anvil to remove at least the verified RFID tags from the first web, rotating the anvil to transfer the verified RFID tags cut from the first web away from the first web, placing the verified RFID tags from the anvil onto a second web to form a third web having a first major surface, preventing the defective RFID tags from being placed from the anvil on the second web, and re-testing the RFID tags forming at least a portion of the third web. Other aspects and embodiments are provided herein.

22 Claims, 20 Drawing Sheets

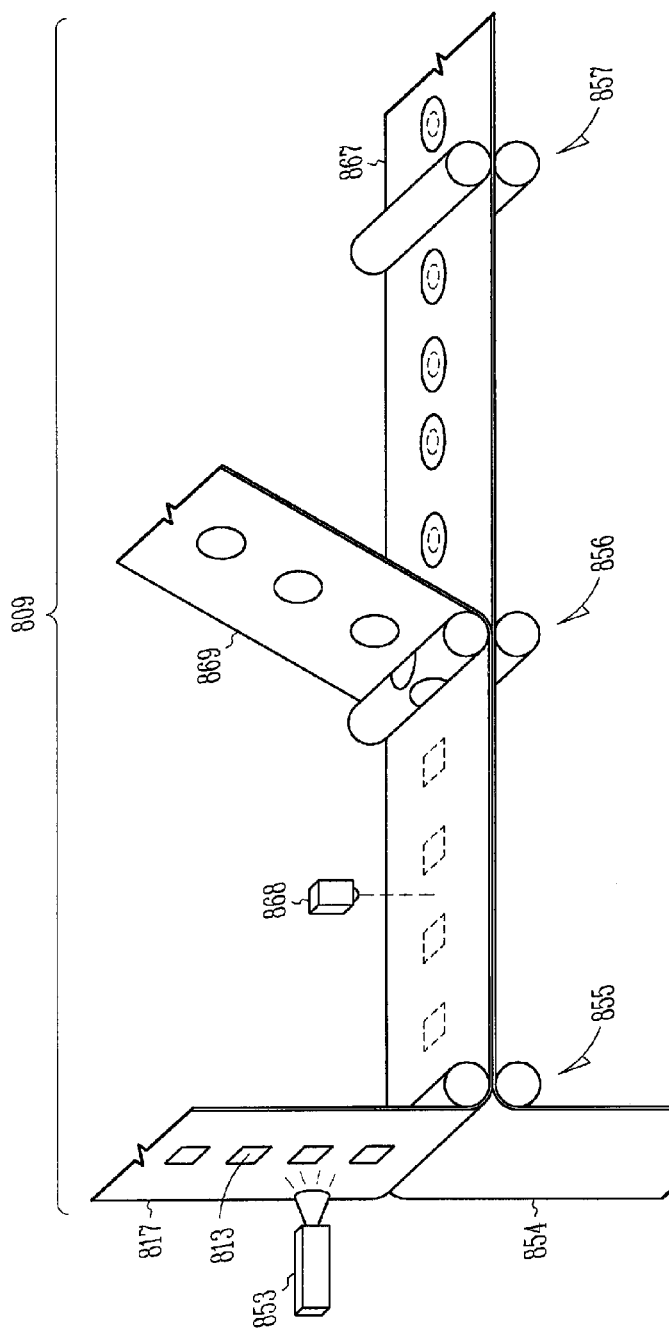
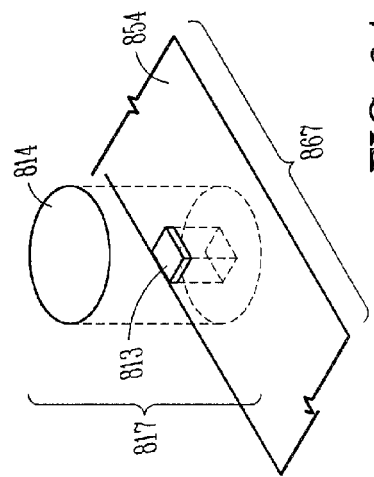
FIG. 8
FIG. 8A

SYSTEMS AND METHODS OF CONVERTING RFID LABELS

FIELD

This application relates generally to web converting and, more particularly, to systems and methods for converting a web of RFID tags into RFID labels.

BACKGROUND

Radio Frequency Identification (RFID) technology use continues to expand as the costs and capabilities of implementing RFID become easier to justify and promote. RFID labels, for example, can be encoded with useful and reliable information, and allow an RFID system to monitor and react to the people, places and things on which the labels can be attached. Known RFID labels include a RFID tag between embedded between layers of material. As RFID tags and labels are manufactured, many circumstances can render the tags defective. Completely processing and shipping a defective RFID tag wastes material, labor and financial resources of both the manufacturer and the end user.

SUMMARY

Various system embodiments comprise a machine controller, a first verification assembly, a first accumulator device, a first processing assembly, a second accumulator device a converting apparatus, and a second verification assembly. The machine controller and the first verification assembly are adapted to test a plurality of RFID devices forming at least a portion of a first web. The test includes verifying the operation of each RFID device prior to subsequent processing. The first accumulator device is adapted to receive the first web from the first verification assembly and to tension and accumulate the first web for subsequent processing. The first processing assembly is adapted to receive the first web from the first accumulator device. The machine controller and the first processing assembly are adapted to separate RFID devices forming a portion of the first web and place separated RFID devices onto a second web to form a third web. The third web has a first major surface and a second major surface. The RFID devices are placed on at least a portion of the second major surface. The first verification apparatus, the first processing assembly and the machine controller are further adapted to prevent the placement of defective RFID devices onto the second web. The second accumulator device is adapted to receive the third web and to tension and accumulate the third web for subsequent processing in the converting apparatus. The converting apparatus is adapted to receive the third web from the second accumulation device. The machine controller and the converting apparatus are adapted to add additional web and process the third web to form a web of RFID labels. The second verification assembly is adapted to receive the web of RFID labels. The machine controller and the second verification assembly are adapted to test a plurality of RFID devices. The test includes verifying the operation of the RFID devices after the first processing assembly.

Various system embodiments comprise means for testing a plurality of RFID devices on a first web to identify verified RFID devices and defective RFID devices, means for preparing the first web for subsequent processing after testing the plurality of RFID devices, means for transferring verified RFID devices from the first web to a second web to form a third web without transferring defective RFID devices from the first web to the second web, means for preparing the third web for subsequent processing, means for transforming the third web with the verified RFID devices into a plurality of RFID labels, and means for testing the plurality of RFID labels, including means for distinguishing between verified RFID labels and defective RFID labels. The means for preparing the first web for subsequent processing after testing the plurality of RFID devices includes means for maintaining tension in the first web and means for accumulating the first web, and the means for preparing the third web for subsequent processing includes means for maintaining tension in the third web and means for accumulating the third web.

Various method embodiments comprise testing a plurality of RFID tags forming at least a portion of a first web to identify defective RFID tags and verified RFID tags, cutting the first web between a rotary die and an anvil to remove at least the verified RFID tags from the first web, rotating the anvil to transfer the verified RFID tags cut from the first web away from the first web, placing the verified RFID tags from the anvil onto a second web to form a third web, preventing the defective RFID tags from being placed from the anvil onto the second web, and re-testing the RFID tags forming at least a portion of the third web.

This Summary is an overview of some of the teachings of the present application and not intended to be an exclusive or exhaustive treatment of the present subject matter. Further details about the present subject matter are found in the detailed description and appended claims. Other aspects will be apparent to persons skilled in the art upon reading and understanding the following detailed description and viewing the drawings that form a part thereof, each of which are not to be taken in a limiting sense. The scope of the present invention is defined by the appended claims and their equivalents.

BRIEF DESCRIPTION OF THE DRAWINGS

FIG. 1A illustrates RFID tags forming at least a portion of the component web in the embodiment of FIG. 1.

FIG. 8 illustrates an embodiment of the converting apparatus of FIG. 7.

FIG. 8A illustrates an exploded view of the resultant web exiting the embodiment of the post-placement converting apparatus illustrated in FIG. 8.

DETAILED DESCRIPTION

The following detailed description of the present subject matter refers to the accompanying drawings which show, by way of illustration, specific aspects and embodiments in which the present subject matter may be practiced. These embodiments are described in sufficient detail to enable those skilled in the art to practice the present subject matter. Other embodiments may be utilized and structural, logical, and electrical changes may be made without departing from the scope of the present subject matter. References to "an", "one", or "various" embodiments in this disclosure are not necessarily to the same embodiment, and such references contemplate more than one embodiment. The following detailed description is, therefore, not to be taken in a limiting sense, and the scope is defined only by the appended claims, along with the full scope of legal equivalents to which such claims are entitled.

Figure 1:
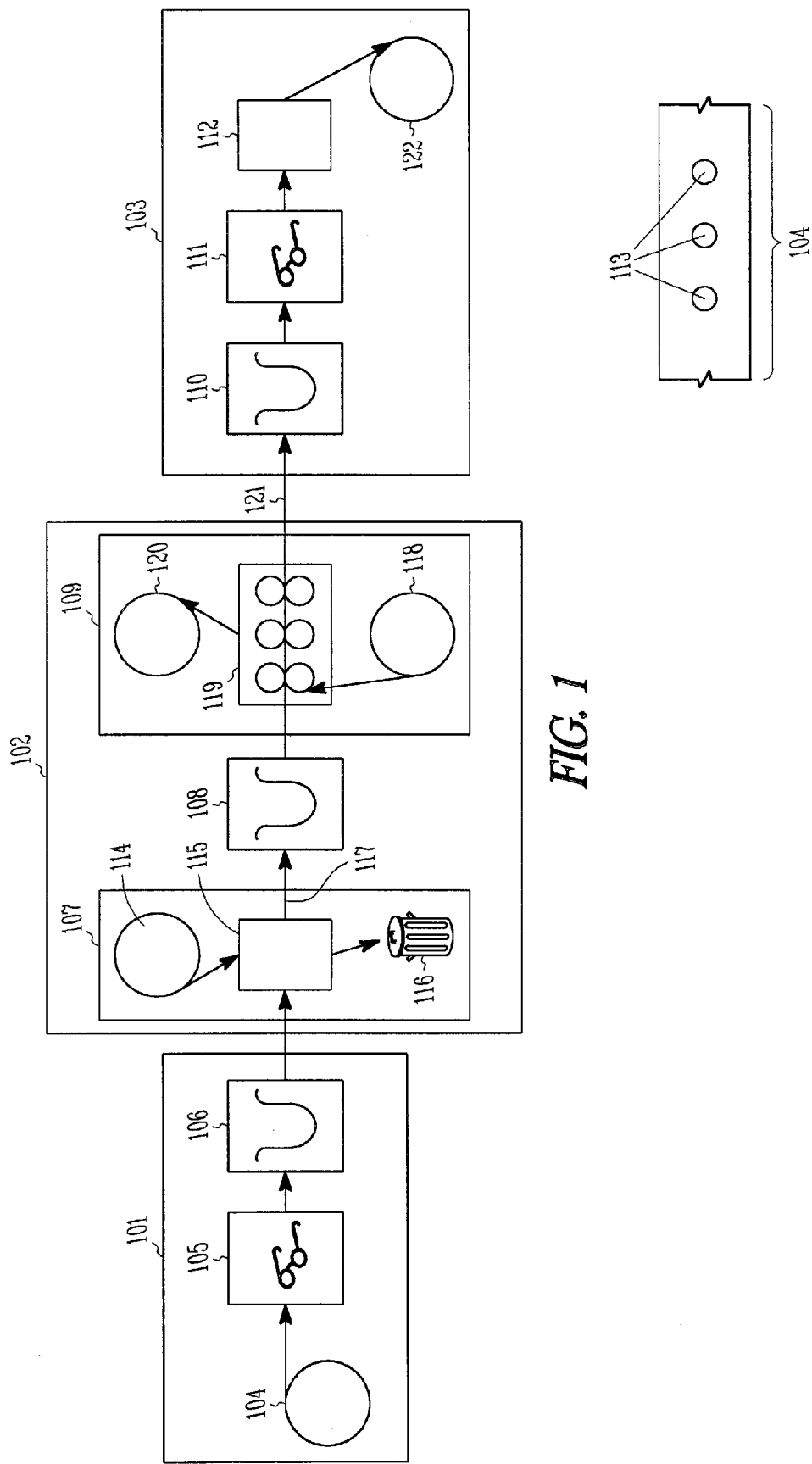
FIG. 1 illustrates a block diagram of a system for manufacturing web based articles according to various embodiments.

FIG. 1 is a block diagram embodiment of a system to produce verified assembled articles. The illustrated system includes a pre-placement verification apparatus 101, a placement and converting apparatus 102, and a post-placement verification apparatus 103. The illustrated pre-placement verification apparatus is adapted to receive the component web 104, and includes a first verification apparatus 105 and a pre-placement accumulator 106. The illustrated placement and converting apparatus 102 includes a placement apparatus 107, an accumulator 108, and a post-placement converting apparatus 109. The illustrated post-placement verification apparatus 103 includes a post-placement converting accumulator 110, a second verification apparatus 111, and a post-verification converting apparatus 112. In various embodiments, the assembled article includes an embedded component, such as one or more RFID tags in RFID labels. One of skill in the art will understand upon reading this disclosure that the system can be modified to produce other articles with embedded components, where detection and rejection of failed components can reduce costs associated with manufacturing reject articles. In the illustrated embodiment of FIG. 1A, RFID tags 113 form at least a portion of the component web 104. The placement and converting apparatus 102 mates the RFID tags to additional web material to form various embodiments of a RFID label.

The placement apparatus 107 includes carrier web 114, the cut, transfer and place apparatus 115 and a reject system 116 to accumulate and dispose of rejected RFID tags. The web illustrated at 117 includes a carrier web 114 with RFID tags placed upon it. The converting apparatus 109 may include a roll of liner 118, a series of converting stations 119, and spindles 120 to supply or remove web. In the illustrated embodiment, a liner 118 is added to the assembled web 117 and laminated at 119. The laminated web is converted at 119 so as to "kiss cut" the carrier web and remove the resulting matrix to spindle 120.

Embedded components, such as RFID tags, can be susceptible to a host of circumstances compromising their integrity to perform as intended. Inspection of components can enable corrective actions to minimize the impact defective components have on the finished product. In the embodiment illustrated in FIG. 1, the RFID tags, forming at least a portion of the component web 104, are tested at the first verification apparatus 105, prior to any assembly processing. When the RFID tags are cut in preparation of placement on the carrier web 114 at the cut transfer and place apparatus 115, the RFID tags found to be defective at the first verification apparatus 101 are not placed on the carrier web 114 and are sent to the reject system 116. Ideally, the web exiting the placement and converting apparatus 102 is free of defective tags. However, the assembly operations included in the placement and converting apparatus 102, as well as other operations, can damage the embedded tags. The post-placement verification apparatus 103 checks the integrity of the embedded tags as the assembled and converted web 121 passes through the second verification assembly 111. In addition to checking the integrity of the embedded RFID tags at the post placement verification apparatus, the assembled web 121 of RFID labels can be marked to indicate defective RFID tags. Verified RFID labels, those not found to be defective, may be marked at the post-placement verification apparatus 103 with additional value added data. The assembled web 121 is further processed at the post verification converting apparatus 112 to form completed labels or, as illustrated, a roll of labels 122.

Motion of web through each area of the system may require movement at different velocities than the movement at adjacent operations. Several accumulators allow the illustrated system to operate in a coordinated and sustained fashion. The accumulators assist the motion of the web between areas of the operation that require incompatible simultaneous web movement. Examples of accumulators include dancers, festoons and, as illustrated, vacuum boxes. In the embodiment of FIG. 1, a pre-placement accumulator 106 assists in coordinating the motion of the web between the pre-placement verification apparatus 105 and the placement and converting apparatus 102. Additionally, a post-placement accumulator 108 assists in coordinating the motion of the web between the placement apparatus 115 and the post-placement converting apparatus 109. The embodiment of FIG. 1 also shows a post-placement converting accumulator 110. The post-placement converting accumulator 110 coordinates the motion of the web between the post-placement converting apparatus 109 and the second verification assembly 111. In addition to providing coordination functions, various embodiments of the accumulation devices also apply a desired tension to the web.

Figure 2:
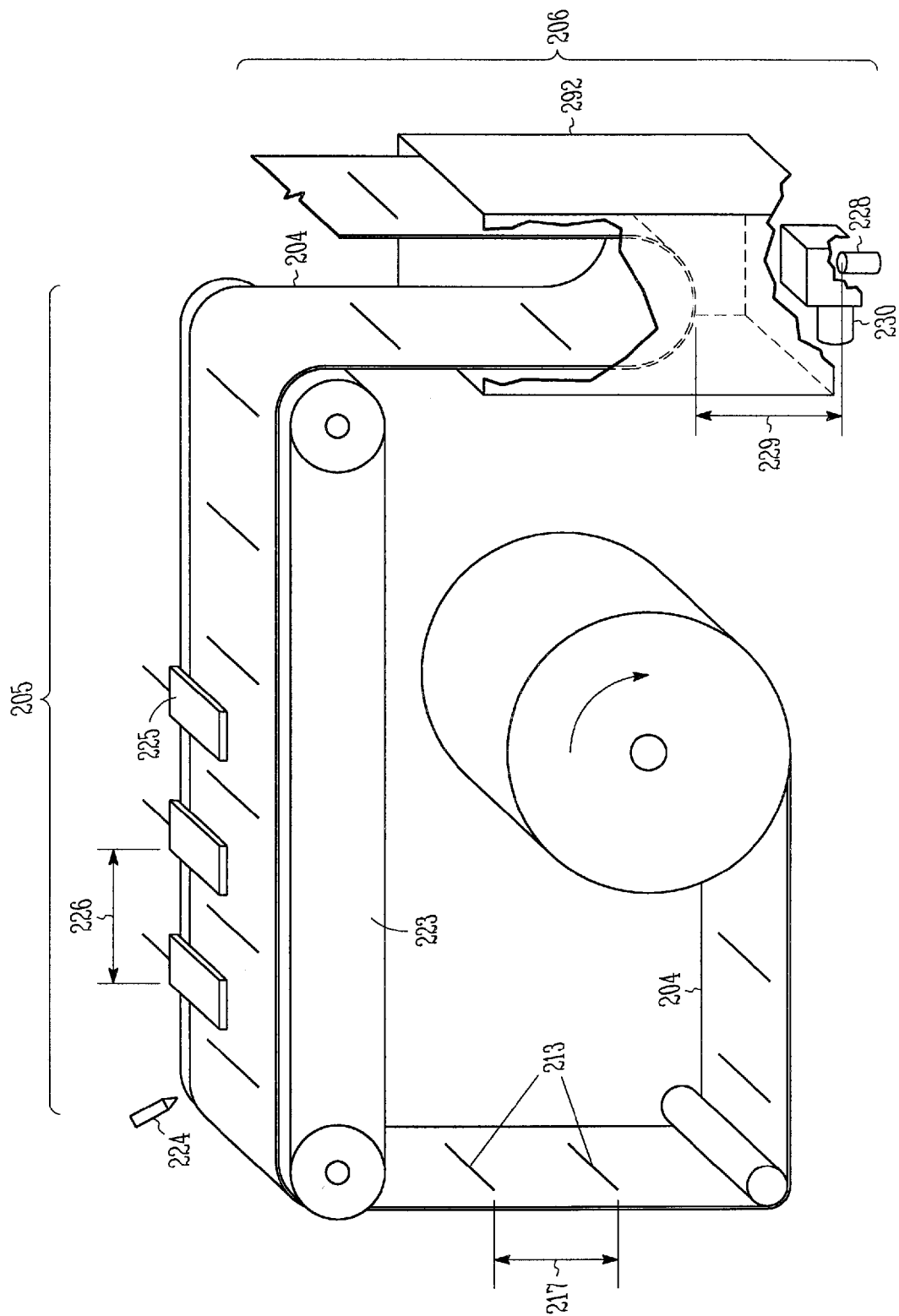
FIG. 2 illustrates an embodiment of a pre-placement verification apparatus of FIG. 1.

FIG. 2 illustrates an embodiment of the pre-placement verification apparatus 101 of FIG. 1. In the illustrated embodiment, web material 204 is fed to a first verification assembly 205 and a pre-placement accumulator 206. The illustrated web material includes components 213 that are evenly spaced at a nominal spacing 217. The first verification assembly includes a servo driven vacuum conveyor 223, a component sensor 224 and a plurality of inspection devices 225 spaced a nominal distance apart 226. In the illustrated embodiment, the pre-placement verification apparatus moves the component web 204 via the servo driven vacuum conveyor 223 to a position referenced by the component sensor 224. An inspection device, or an array of inspection devices 225, verify the integrity of a plurality of features of each component. A successful inspection operation indicates the part is "validated", or acceptable for further processing. An unsuccessful inspection operation, or one that indicates the component does not conform to predetermined standards, indicates a "defective" component. The machine controller monitors and records the result of each inspection operation for future reference. Depending on the component to be embedded, the inspection devices 225 may include electronic readers, vision systems, infrared cameras, thermal imaging devices, laser inferometers, x-ray systems or a combination thereof. In the illustrated embodiment, the inspection devices represent RFID readers. RFID readers may include functionality to write data to RFID tags. In the illustrated embodiment of FIG. 2, the conveyor 223 moves the component web 204 containing the RFID tags 213. The machine controller triggers the RFID reader when an RFID tag is presented to the reader 225. A sensor 224 assists the machine controller in coordinating movement of the web and triggering the readers. The sensor 224 detects each product, or a reference mark associated with each product, as the web is moved. The machine controller records the position of the conveyor 223 at the instant the sensor detects 224 detects a RFID tag passing through the sensor's detection area. The recorded position of one of the RFID devices 213 is used to calculate the future position of the web at which each RFID tag, in a group to be inspected, is presented to a RFID reader. The calculated position depends on a number of factors including the number of RFID readers 225, the spacing of the RFID readers 226, the spacing of the RFID tags 227 and the number of times and manner each product is inspected. The machine controller triggers the inspection process and records the results for future reference as the web reaches the calculated position.

Movement of the component web via the conveyor 223 is contingent upon several factors, one of which is the ability of down web apparatuses to accept more web for processing. If down-web apparatuses require the component web 204 to move at different times and/or velocities than the pre-placement apparatus, an accumulator can be used for sustained and coordinated operation of the machine. According to various embodiments, the accumulator may include a dancer, a festoon or a vacuum box.

An embodiment of an accumulator 206 includes a vacuum box 292, a sensor 228 and a vacuum port 230. The vacuum box accumulator 206 draws excess input web 204 within the vacuum box 292 and releases the web for down web operations as needed. A vacuum source connected to a vacuum port 230 of the vacuum box 292 provides a flow of air to draw the web into the vacuum box 292. A vacuum box sensor 228 monitors the depth of the web loop within the vacuum box 292 to coordinate the flow of incoming web against the flow of outgoing web. The machine controller compares the vacuum box sensor 228 signal to a value corresponding to the signal generated when the web loop is at a preset level 229. The difference between the two signals modifies a command signal that can impact the level of the web in the vacuum box 292. In the illustrated embodiment, the machine controller modifies the speed of the pre-placement verification component web movement to hold the depth of the web within the vacuum box 292 near a preset level 229. In various embodiments, based on accumulator feedback, the machine controller can vary a number of parameters to coordinate the movement of web through the accumulator including trigger times, acceleration, speed, deceleration, delays and combinations thereof.

Figure 3:
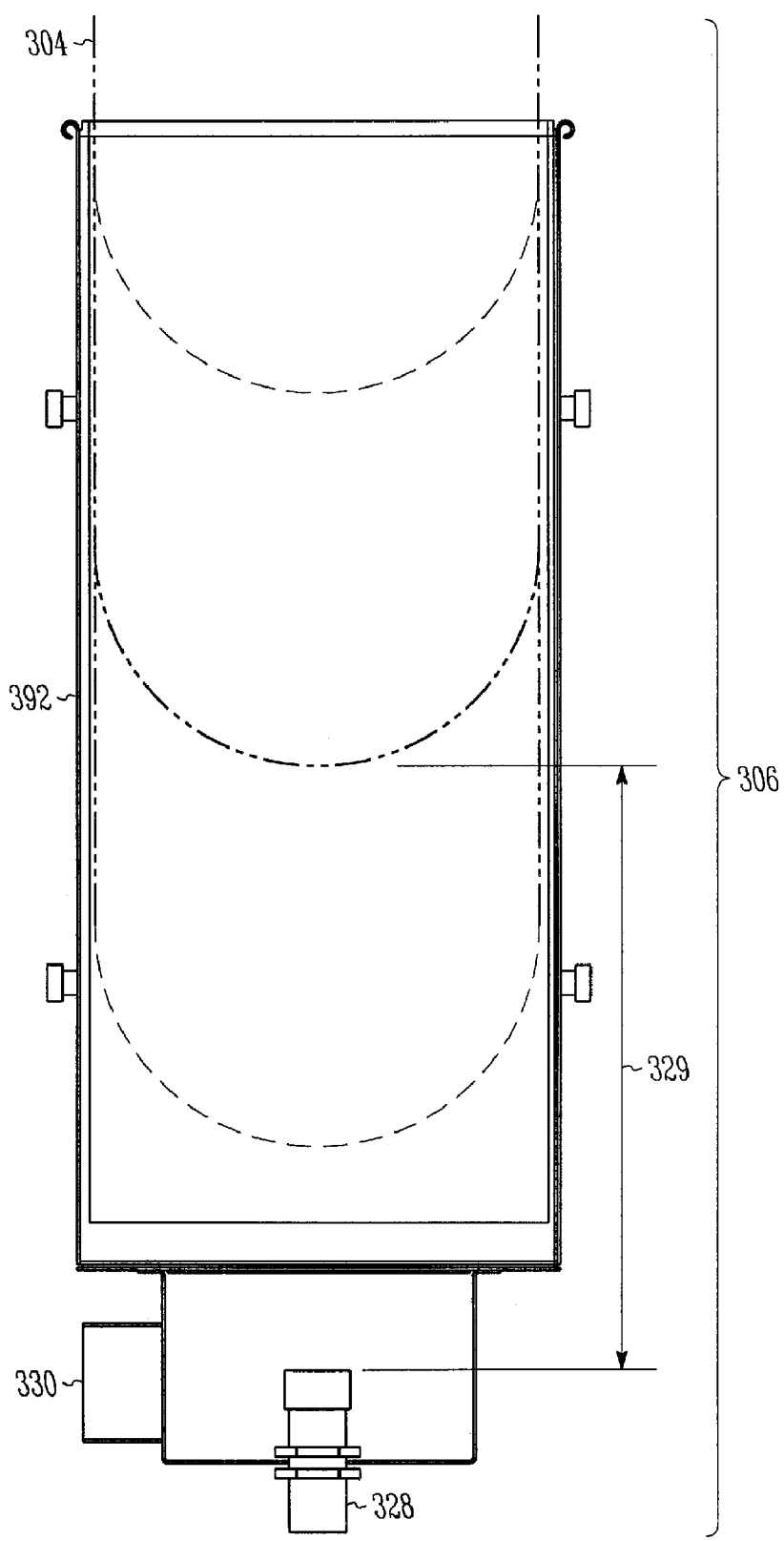
FIG. 3 illustrates an embodiment of a vacuum box accumulator of FIG. 1.

FIG. 3 illustrates an embodiment of a vacuum box accumulator 306. The vacuum box accumulator 306 includes a vacuum box 392, a loop sensor 328 and a vacuum port 330. The accumulator maintains a supply of web 304 for further processing, when the processing apparatus up-web of the accumulator cannot be run synchronously with the processing apparatus down-web of the accumulator. "Up-web" refers to locations in the direction opposite the flow of the web. Down-web refers to locations in the direction of the web flow. The accumulator is connected to a source of vacuum at a vacuum port 330. The vacuum draws web into the box 392 and maintains tension on the web. A vacuum box sensor 328 senses the distance between the sensor 328 and the loop created by the web 304. The machine controller compares the sensor signal to a setpoint level 329 and calculates an error value. The machine controller, based on the error value, modifies the nominal speed of either an up-web process or a down-web process to maintain the distance between the sensor 328 and the web loop as close to the setpoint value as possible.

Figure 4:
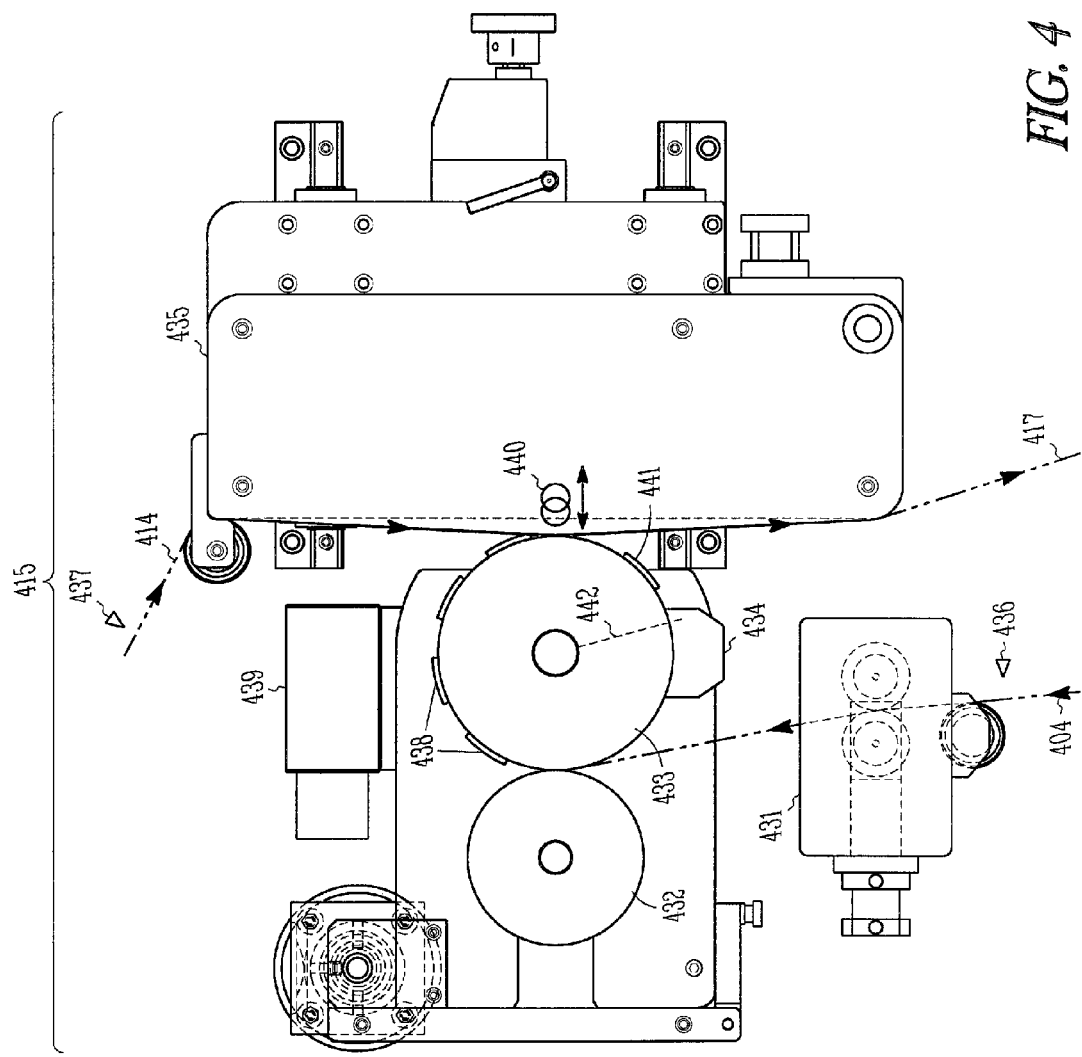
FIG. 4 illustrates an embodiment of a cut and place apparatus of FIG. 1.

FIG. 4 illustrates an embodiment of the cut and placement apparatus 415. In various embodiments, the cut and placement apparatus includes a nip station 431, a die 432, a vacuum anvil 433, a reject assembly 434, a placement apparatus 435, a RFID registration sensor 436 and a carrier web registration sensor 437. The cut and placement apparatus 415 cuts, transfers, and places validated RFID devices 438 on the carrier web 414. In the illustrated embodiment, the component web 404 contains RFID tags. The component web passes through a pair of nip rolls at a servo driven nip station 431. The component web 404 passes between a rotary die 432 and a vacuum anvil 433.

In the illustrated embodiment, the rotary die 432 cuts the component web 404 across the web's entire width, separating a length of the web containing at least one RFID tag 438. A RFID registration sensor 436 assists the placement of each cutting operation with respect to the RFID tag. The RFID registration sensor 436 detects either a RFID tag or a reference mark associated with each RFID tag. In various embodiments, upon detecting a RFID tag or a reference mark associated with each RFID tag, the machine controller executes an algorithm to correct and maintain the position of subsequent die cuts relative to the position of incoming components. The algorithm may include recording the positions of the rotary die 432, the anvil 433 or other axes and modifying the motion profile of the servo motor rotating the vacuum anvil and rotary die, or the motion profile of the servo motor rotating the rolls at the nip station 431. The severed RFID tags 438, adhere to the surface of the vacuum anvil 433 by vacuum. A vacuum source is connected to the vacuum anvil 433 through a pair of vacuum manifolds 439 coupled to the ends of the vacuum anvil 433. Vacuum is directed to the surface of the vacuum anvil 433 through a series of surface holes and subsurface channels. The severed RFID tags 438 move with the surface of the vacuum anvil 433 and approach the placement apparatus 435.

The illustrated embodiment of the placement apparatus 435 includes a servo driven vacuum conveyor, with a perforated conveyor belt, and a separate, servo driven bump transfer mechanism 440, including a bump transfer roll. The bump transfer mechanism 440 is located under the surface of the perforated conveyor belt. A carrier web 414 is normally positioned between the vacuum anvil 433 and the placement vacuum conveyor. The carrier web 414 adheres, by vacuum, to the surface of placement vacuum conveyor belt and moves with the servo driven conveyor belt when the machine controller commands the placement vacuum conveyor 435 to move. The bump transfer mechanism 440, when activated, stretches the conveyor belt and moves the conveyor belt and the attached carrier web toward the vacuum anvil 433. The bump transfer mechanism's motion continues until the bump transfer mechanism reaches its maximum travel or bumps the carrier web 414 against the vacuum anvil 433.

As a validated RFID tag 438 approaches the placement apparatus 435, the placement vacuum conveyor and the bump transfer mechanism 440 move in a coordinated fashion with the motion of the vacuum anvil 433, placing the validated RFID tag onto the carrier web 414. In various embodiments, the position of the placed RFID tag is determined relative to the position of a prior-placed RFID tag, such that the distance between subsequently placed RFID tags conform with a manufacturing standard. In the illustrated embodiment, the carrier web contains a registration mark, to which the placement of verified RFID tags is referenced according to a manufacturing standard. A carrier web registration sensor 437 detects passing registration marks. In the illustrated embodiment, the machine control records the position of the vacuum anvil 433 as carrier web registration marks are detected and modifies the motion of the placement vacuum conveyor and bump transfer mechanism 440 to place subsequent RFID tags at a predetermined offset from the position of the detected registration mark.

In the illustrated embodiment, defective RFID tags transferred by the vacuum anvil 433 are not placed on the carrier web 414. As a defective RFID tag approaches the placement apparatus 435 via the vacuum anvil 433, the placement vacuum conveyor temporarily stops moving the carrier web 414 until a non-defective RFID tag is ready to be placed. The vacuum anvil continues transporting the defective RFID tag 441 to the position represented by line 442. Beyond line 442, the surface of the vacuum conveyor is no longer subject to a vacuum source, therefore, the defective RFID module falls into a reject handling system 434. As subsequent, validated RFID tags approach the placement apparatus 435, the placement vacuum conveyor and the bump transfer mechanism 440 move in a coordinated fashion with the motion of the vacuum anvil 433, to place the validated RFID tags onto the carrier web 414, as described above. In the illustrated embodiment, the intermediate web 417 exiting the cut and placement apparatus 415 includes the carrier web 414 and validated RFID tags.

Figure 5:
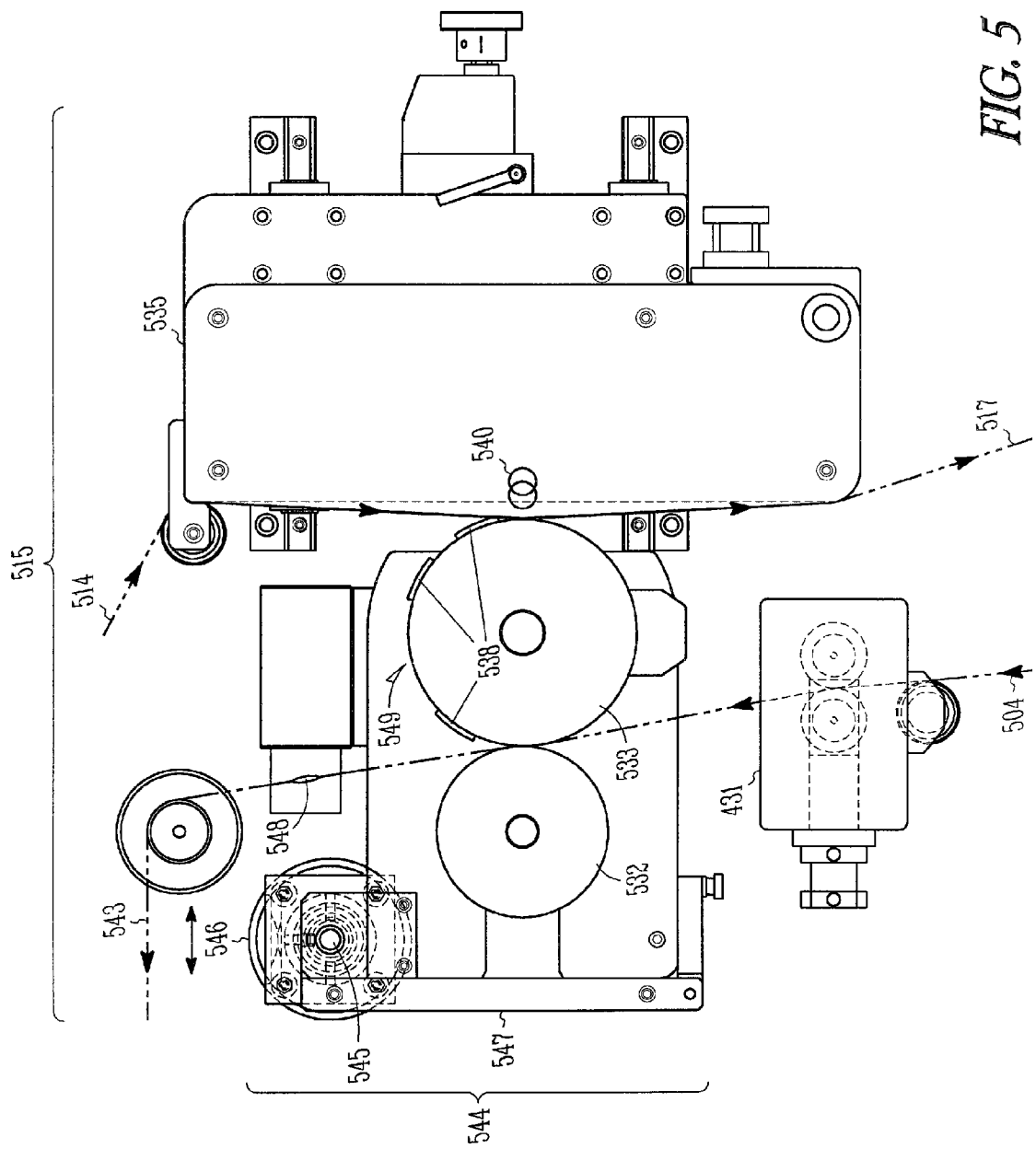
FIG. 5 illustrates an embodiment of a cut and place apparatus of FIG. 1.

FIG. 5 illustrates an embodiment of the cut and place apparatus similar to FIG. 4. In the embodiment of FIG. 5, the rotary die 532 cuts and separates a portion of the component web 50. The remaining portion of the component web forms a component web matrix 543. The component web matrix 543 is pulled from the converting apparatus under tension and further processed. Further processing, according to various embodiments, include rewinding the component web matrix 543 or vacuum removal and chopping of the component web matrix 543. The severed RFID tags 538 adhere to the surface of the vacuum anvil, move toward the placement apparatus 535 and are placed as described in FIG. 4. However, when a portion of the component web 504 containing a defective RFID tag is presented to the area between the rotary die 532 and the vacuum anvil 533, a servo driven die pressure mechanism 544 relieves the cutting pressure applied to the rotary die 532. The servo motor 546 of the die pressure mechanism 544 rotates a shaft with two eccentric lobes 545. The motion of the lobes 545 pivots the lever 547 to adjust the cutting pressure of the rotary die 532. The portion of the web containing the defective RFID device is not cut as it passes between the rotary die 532 and the vacuum anvil 533. The uncut, defective RFID tag 548 remains with the component web matrix 543. When a defective RFID tag 548 remains with the RFID matrix 543, a gap 549 is formed in the plurality of verified RFID tags 538 attached to the surface of the moving vacuum anvil 533. As the gap approaches the placement apparatus 535, the placement vacuum conveyor stops moving the carrier web 514. As subsequent, validated RFID tags approach the placement apparatus 535, the placement vacuum conveyor and the bump transfer mechanism 540 move in a coordinated fashion with the motion of the vacuum anvil 533, to place a verified RFID tag onto the carrier web 514, as described above. In the illustrated embodiment, the intermediate web 517 exiting the cut and placement apparatus 515 includes the carrier web 514 and validated RFID tags.

Figure 6:
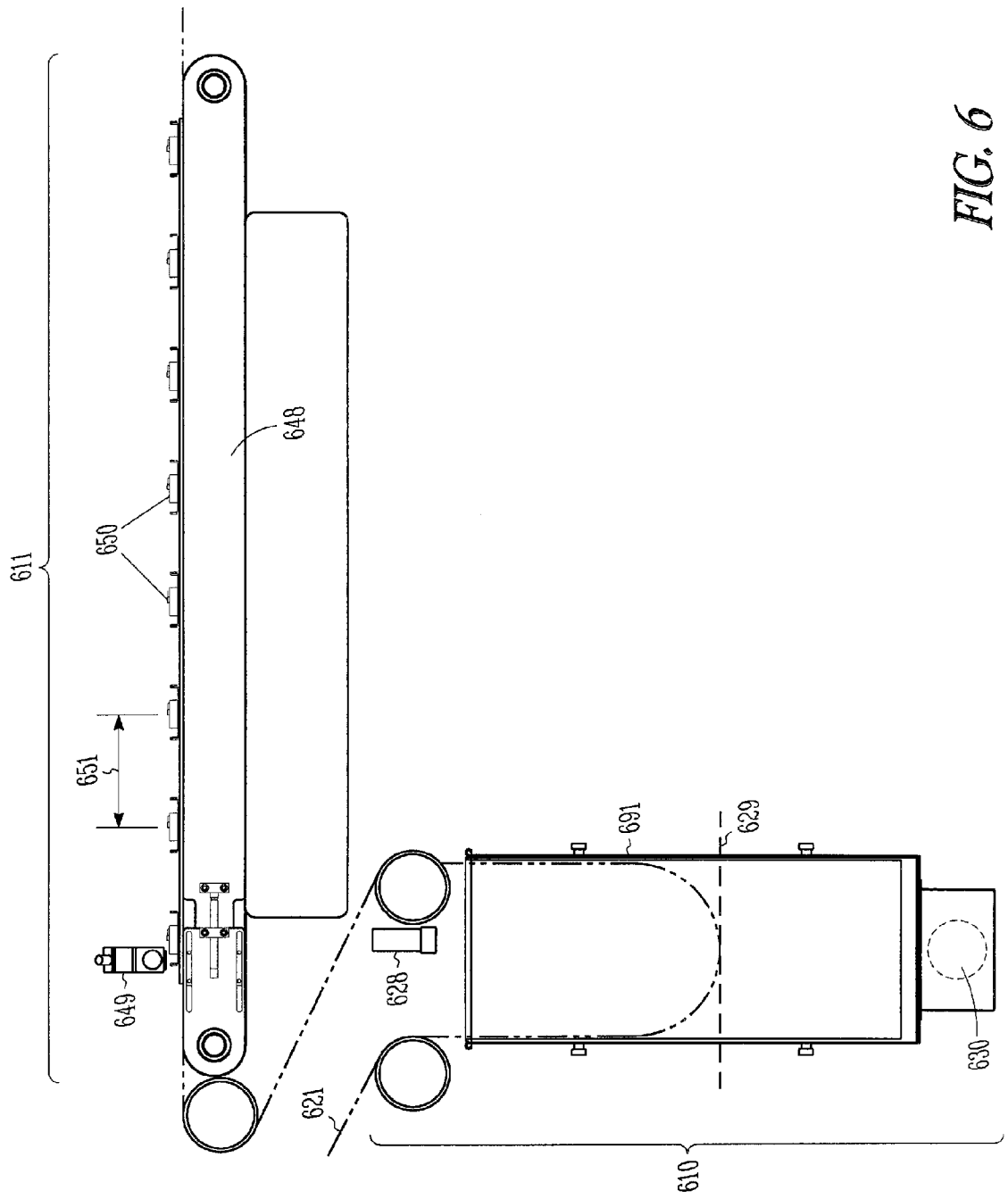
FIG. 6 illustrates an embodiment of a post-placement verification apparatus of FIG. 1.

FIG. 6 illustrates an embodiment of the post-placement verification apparatus of FIG. 1. The illustrated apparatus in FIG. 6 includes a post placement converting accumulator 610 and a second verification apparatus 611. The illustrated accumulator is a similar embodiment to vacuum box accumulator described in FIG. 3. In the illustrated embodiment, the second verification apparatus 611 includes a servo driven vacuum conveyor 648, a component sensor 649 and a plurality of inspection devices 650. In the illustrated embodiment, the post-placement verification apparatus moves the assembled web 621 via the servo driven vacuum conveyor 648 to a position referenced by a component sensor 649. The component sensor 649 detects passing components or reference marks associated with each component. The assembled web of components 621 moves such that an inspection device 650, or an array of inspection devices 650, can verify the integrity of a plurality of features of each component. A successful inspection operation indicates the part is "validated", or acceptable for further processing. An unsuccessful inspection operation, or one that indicates the component does not conform to predetermined standards, indicates a "defective" component. The machine controller monitors and records the result of each inspection operation for future reference. Depending on the component, the inspection devices 650 may include electronic readers, vision systems, infrared cameras, thermal imaging devices, laser inferometers, x-ray systems or a combination thereof. In the illustrated embodiment, the conveyor 648 moves the assembled web 621 containing the RFID tags. The machine controller triggers the RFID reader(s) 650 when an RFID tag is presented to a reader. A sensor 649 assists the machine controller in coordinating movement of the web 621 and triggering the readers 650. The sensor 649 detects each product, or a reference mark associated with each product, as the web 621 is moved. The machine controller records the position of the conveyor 648 at the instant the sensor 649 detects a RFID tag passing through the sensor's detection area. The recorded position of one of the RFID devices is used to calculate the future position of the web at which each RFID tag, in a group of tags to be inspected, is presented to a RFID reader 650. The calculated position depends on a number of factors including the number of RFID readers 650, the spacing of the RFID readers 651, the spacing of the RFID tags in the assembled web and the number of times and manner each product is verified. The machine controller triggers the inspection process and records the results for future reference when the web reaches the calculated position.

Movement of the component web via the conveyor 648 is contingent upon several factors, one of which is the ability of up-web processes to supply assembled web 621 for post-placement verification. If up-web processes require the assembled web 621 to move at different times or velocities then the post-placement verification apparatus 611, an accumulator 610 can be used for sustained and coordinated operation of the machine. According to various embodiments, the accumulator 610 may include a dancer, a festoon or a vacuum box.

An illustrated embodiment of an accumulator is a vacuum box accumulator 610. The vacuum box draws excess input web within the box and releases the web for down-web operations as needed. A vacuum source connected to a vacuum port 630 of the vacuum box provides the flow of air to draw the web into the vacuum box 691. A vacuum box sensor 628 monitors the depth of the web loop within the vacuum box 691 to coordinate the flow of incoming web against the flow of outgoing web. The vacuum box sensor 628 signal is compared to a value corresponding the signal generated when the web loop is at a preset level 629. The difference between the two signals is used to modify a command signal that can impact the level of the web in the vacuum box. In the illustrated embodiment, the machine controller modifies the motion profile of the pre-placement verification component web movement to hold the depth of the web within the vacuum box 691 near a preset level 629. The motion profile may include parameters relating to speed, acceleration, deceleration, motion initialization and dwells.

Figure 7:
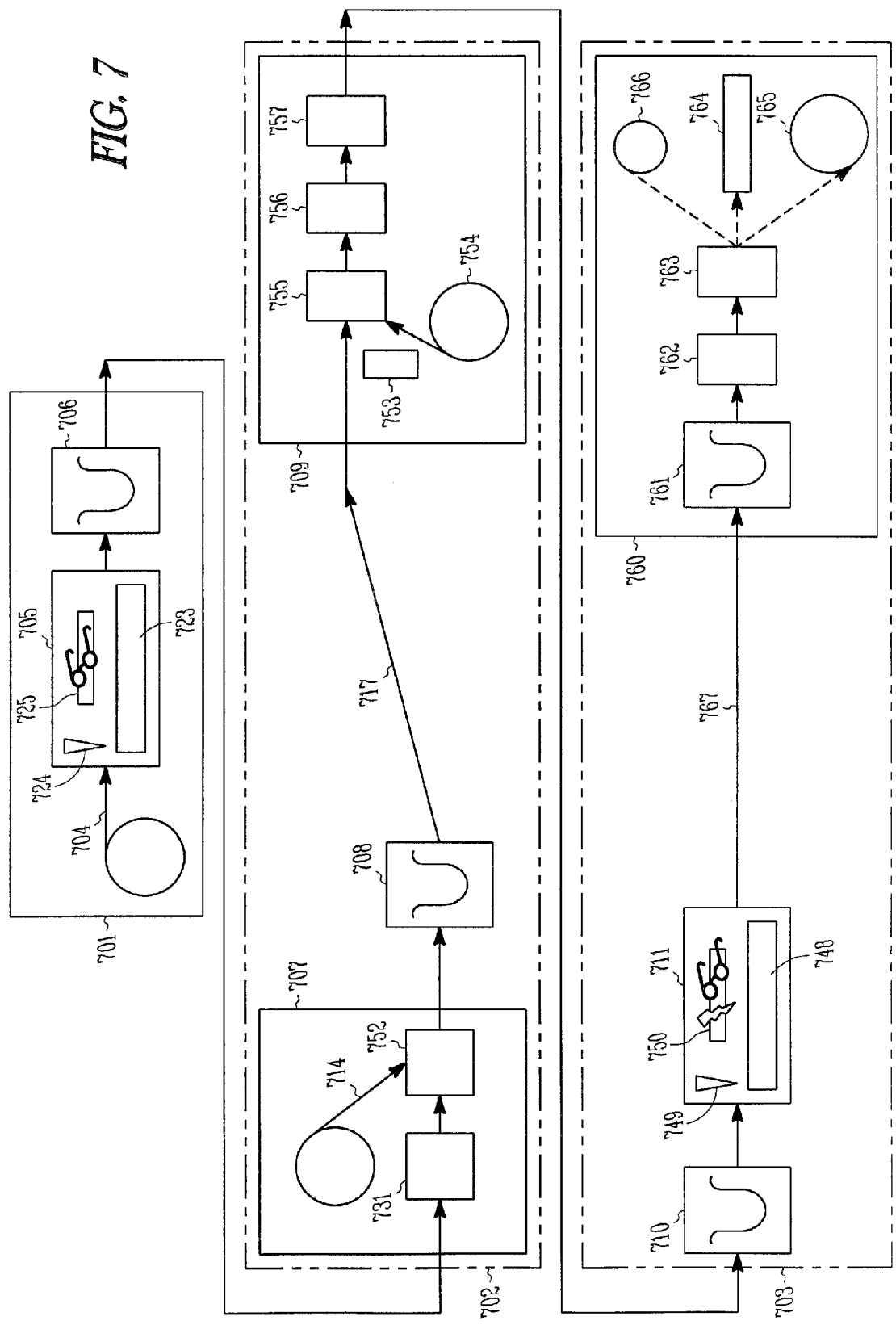
FIG. 7 illustrates an embodiment of the system of FIG. 1.

FIG. 7 illustrates an embodiment of the system of FIG. 1. The illustrated system includes a pre-placement verification apparatus 701, a placement and converting apparatus 702 and a post-placement verification apparatus 703. The pre-placement verification apparatus 701 is adapted to receive a supply of component web 704 and includes a first verification assembly 705 and a pre-placement accumulator 706. The first verification assembly 705 includes a servo driven vacuum conveyor 723, a component sensor 724 and a plurality of inspection devices 725. The placement and converting apparatus 702 includes a placement apparatus 707, a post placement accumulator 708 and a first converting apparatus 709. The placement apparatus 707 includes a nip station 731, a cut and transfer apparatus 752, and a placement apparatus 735. The placement apparatus is adapted to receive a supply of carrier web 714. The first converting apparatus 709 includes an adhesive applicator 753, a supply of liner web 754, a lamination station 755, a die cut station 756 and a nip station 757. The post placement verification apparatus 703 includes a post verification converting accumulator 710, a bar code reader, a second verification assembly 711, a web marking device and a second converting apparatus 760. The second verification assembly includes a servo driven vacuum conveyor 748, a component sensor 749 and a plurality of inspection devices 750. In various embodiments, the second converting assembly 760 may include a pre-converting accumulator 761, a nip station 762, a die station 763, a take-away conveyor system 764, a product spindle 765 and a matrix spindle 766. In the illustrated embodiment, the pre-placement verification apparatus 701 verifies the components forming at least a portion of the component web 704. A servo driven vacuum conveyor 723 moves the component web 704 through the pre-placement verification apparatus 701. The product sensor 724 detects each individual row of components in the component web 704 such that the conveyor presents each component to an inspection device 725. The inspection device 725, in various embodiments, may be an electronic reader, a vision system or other apparatus configured for the product being inspected. In various embodiments, the pre-placement verification apparatus and the down-web apparatuses may require different web motion. An accumulation apparatus 706 may be implemented for sustained and coordinated operation with the adjacent apparatus.

The component web 704 is moved through the placement and converting apparatus 702. In the placement and converting apparatus 702, the component web 704 is cut, transferred, and placed on a carrier web 714 or rejected, not necessarily in that order. The order of the cut, transfer, placement and reject operations depend on a number of parameters including whether the components in the component web span the entire cross web direction of the component web or only a portion. An infeed apparatus 731 supplies the component web 704 to the cut and transfer apparatus 752. The components placed on the carrier web 714 form an intermediate web 717. In the illustrated embodiment, the post-placement accumulator 708 facilitates the short-term incompatible movement of the intermediate web between the cut and placement apparatus 707 and the first converting apparatus 709.

In various embodiments, a nip station 757 moves the intermediate web 717 through the post-placement converting area 709. In various embodiments, the post-placement converting area offers many options for processing of the intermediate web 717 in a plurality of die or nip stations represented in FIG. 7 as 755, 756 and 757. In various embodiments, operations such as die perforation, slitting, printing, die cutting, die kiss-cutting, laser cutting, laser printing or combination thereof can be executed.

In the illustrated embodiment, the intermediate web 717 is laminated to a liner web 754 at nip station 755. In various embodiments, the surface of the carrier web 714, upon which the component is placed, includes a layer of adhesive. In various embodiments, the placed component interrupts a continuous adhesive surface. Therefore, prior to lamination, an adhesive applicator 754 places a layer of adhesive material onto the intermediate web 717 to the approximate area occupied by the placed component. In various embodiments, the application of a material serves the dual purpose of providing a protective layer for the component and providing a continuous surface of exposed adhesive for lamination to an additional carrier web 714 or liner 754. In various embodiments, the laminated web may be further converted to form a resultant web 767. In various embodiments, prior to lamination, the adhesive applicator 754 places a layer of adhesive material onto the liner web 754 to the approximate area occupied by the placed components on the carrier web 714. In the illustrated embodiment, the components in the resultant web 767 are re-verified and converted a second time. In the illustrated embodiment, an accumulator 710 assists in regulating the movement of web through the post-placement verification apparatus 711. The machine controller restricts movement of the web through the post placement verification apparatus when the supply of web in the accumulator 710 is inadequate. In the illustrated embodiment, a servo driven vacuum conveyor 748 moves the web 767 through the post-placement verification apparatus. The component sensor 749 detects each individual row of product as the conveyor 748 moves the web 767. The machine controller records the position of the conveyor each time a component triggers the component sensor 749. The machine controller triggers the inspection operation of the plurality of inspection devices 750 when a component is presented to an inspection device 750. In various embodiments, the inspection device may be an electronic reader, a vision system or combination of devices configured for the product being inspected.

In the illustrated embodiment of FIG. 7, the resultant web 767 is converted a second time in a post-verification converting apparatus 760. In various embodiments, the post-verification converting apparatus offers many options for processing of the resultant web 767 in a plurality of die or nip stations represented in FIG. 7 as 762 and 763. In various embodiments, operations such as die perforation, slitting, printing, die cutting, die kiss-cutting, laser cutting, laser printing or combination thereof can be executed. In the illustrated embodiment, an accumulator 761 regulates the movement of web through the post-placement post-verifcation converting apparatus 760. The machine controller restricts movement of the web through the post-placement converting apparatus when the supply of web in the accumulator 761 is inadequate. In an illustrative embodiment, the resultant web 767 is rewound on a spindle 765 to form a roll of web. A nip station 762 moves the web through the post-verification converting area. In other embodiments, the resultant web 767 is cut into individual parts in a die station 763 and transferred away from the die station on a conveyor 764. In various embodiments, cutting the resultant web 767 at die station 763 will result in a resultant web matrix 766 which, as illustrated, is rewound on a spindle. In various embodiments, the resultant web matrix 766 is evacuated from the die station 763 by a vacuum system, chopped and deposited in a container for further processing.

FIG. 8 illustrates an embodiment of the post-placement converting apparatus 809 represented in FIG. 7 at 709. In the illustrated embodiment of FIG. 8, adhesive is applied 853 to an intermediate web 817, a liner 854 is laminated to the intermediate web 817 in a lamination station 855, the laminated web is kiss-cut in a die station 856, a matrix 869 is delaminated from the kiss-cut web and a nip station 857 pulls the resultant web 867 from the post-placement converting area 809. In the illustrated embodiment, a registration sensor 868 detects either the placed devices 813 in the intermediate laminated web, or a pre-printed reference mark on the intermediate web. The machine controller records the position of the "kiss-cut" die station 856 when the registration sensor 868 is triggered. The machine controller modifies the motion of the "kiss-cut" die station 856 to place subsequent "kiss-cuts" at a predetermined position with respect to the reference detected by the registration sensor 868. FIG. 8A illustrates an exploded view of the resultant web 867 exiting the embodiment of the post-placement converting apparatus 809 of FIG. 8. In various embodiments, the resultant web 867 includes a liner web 854, and a portion of the intermediate web 817. The intermediate web includes the placed devices 813 and an island of carrier web 814.

Figure 9:
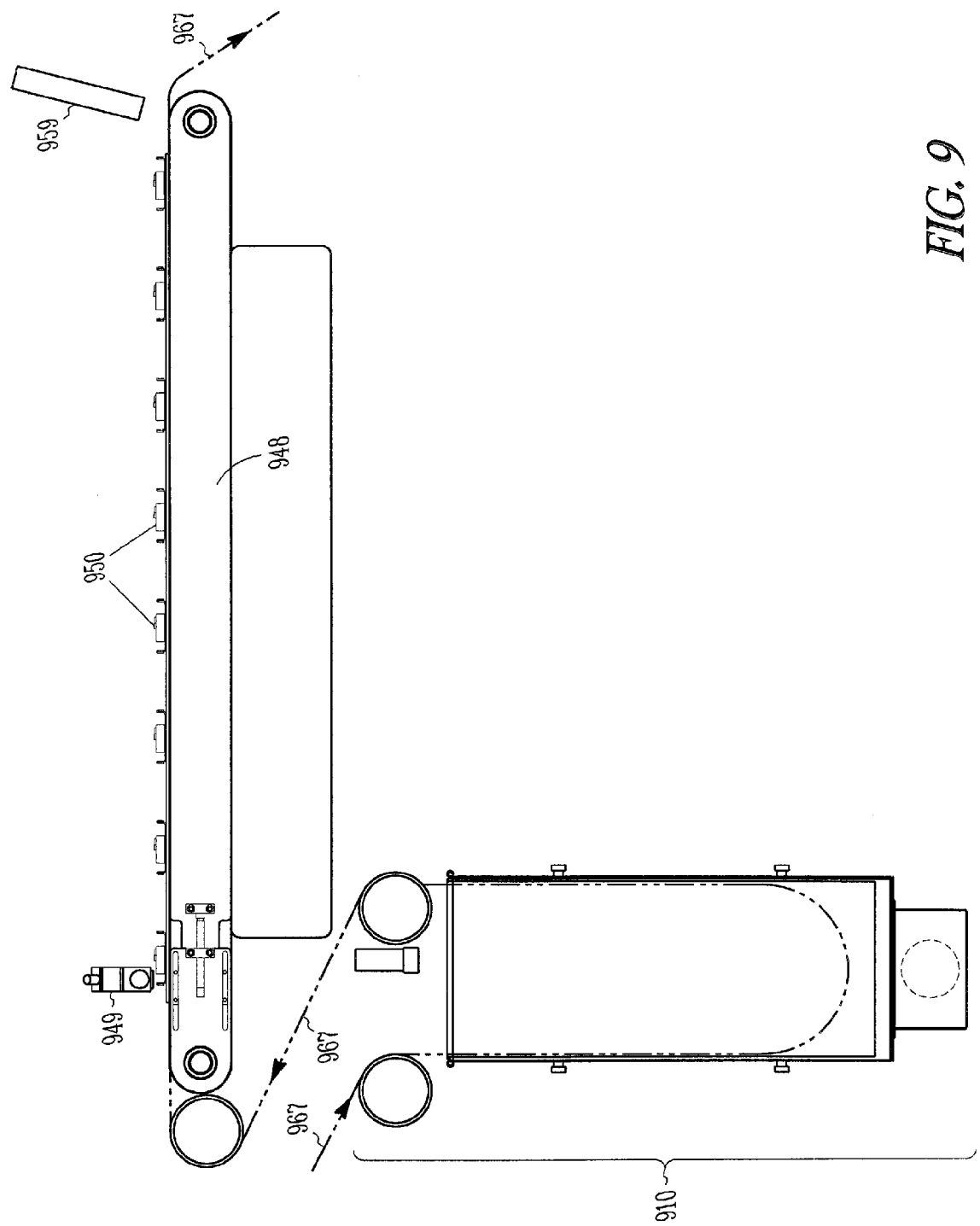
FIG. 9 illustrates an embodiment of the second verification apparatus employing a marking device.

FIG. 9 illustrates an embodiment of the second verification apparatus of FIG. 7 and FIG. 6. The illustrated embodiment includes a post placement converting vacuum box accumulator 910, a vacuum conveyor 948, a component sensor 949, a plurality of inspection devices 950 and a web marking device 959. In the illustrated example, the inspection devices are RFID readers and the components are RFID tags. The web 967 entering the apparatus includes RFID tags placed on a carrier web. In various embodiments, the web also includes a liner laminated opposite the carrier web in a fashion so as to enclose the RFID tags between the carrier web and the liner. The illustrated embodiment inspects the web as described above. The illustrated embodiment includes a web marking device 959. In various embodiments, a marking device includes a web based ink-jet printer, laser printer or thermal printer. In the illustrated embodiment, the web marking device 959 marks the carrier web covering a RFID device found to be defective as a result of the verification process in the second verification apparatus 911. In various embodiments, in addition to marking the carrier web of defective RFID devices, the marking device 959 prints product specific data supplied by the manufacturer on the carrier web of verified devices.

Figure 10:
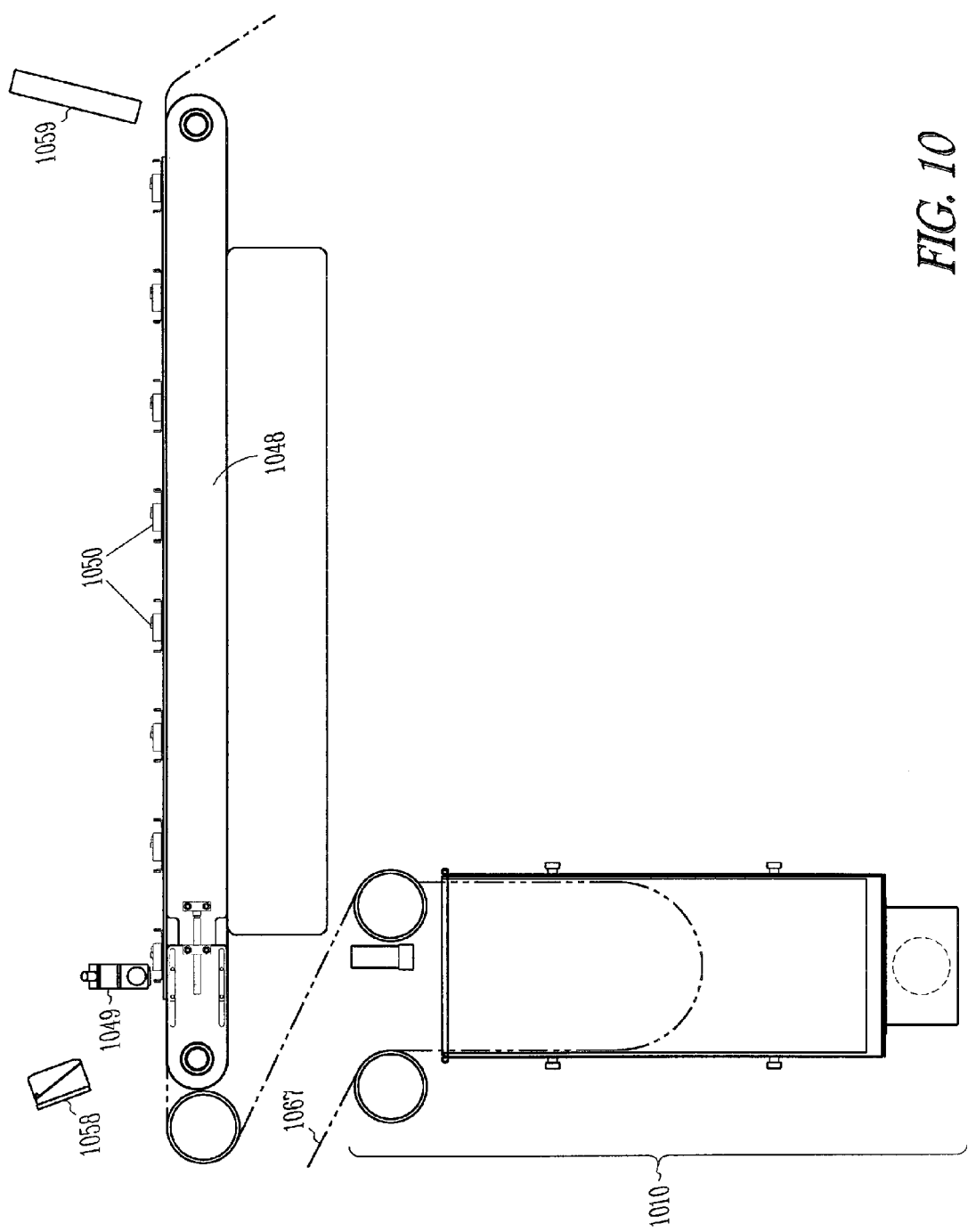
FIG. 10 illustrates an embodiment of the second verification apparatus employing a bar code reader and a marking device.

FIG. 10 illustrates an embodiment of the post-placement verification apparatus similar to the embodiments of FIGS. 6, 7 and 9. In the illustrated embodiment of FIG. 10, the post-placement verification apparatus includes an accumulator 1010, a servo controlled vacuum conveyor 1048, a component sensor 1049, a bar code reader 1058 and a marking device 1059. In various embodiments, the incoming web 1067 includes a pre-printed bar code for each placed RFID tag. The machine controller triggers the bar code reader to read each barcode as the web of RFID tags pass. The machine controller records the bar code data read by the bar code reader 1058 for future reference. As the web of RFID tags move out of the second verification area, the marking device 1059 marks the carrier web of each defective tag to identify the tag as defective. In various embodiments, the marking device 1059 marks the carrier web of each verified tag with text translated from the adjacent barcode and other product specific data supplied by the manufacturer.

Some RFID readers 1050 are capable of writing to RFID tags, as well as, reading RFID tags. In various embodiments of FIGS. 6, 7 and 9, the inspection operation includes writing data to the RFID tags. In various embodiments, write data includes sequential numbering of the RFID devices, data supplied by the manufacturer such as lot and date codes, translated bar code data from the carrier web or combinations thereof. In the illustrated embodiment, the RFID readers 1050 write data to the RFID tags as well as read the RFID tags as part of the inspection process. Failure to read or failure to read the expected data from a tag forms the basis of finding the tag defective.

Figure 11:
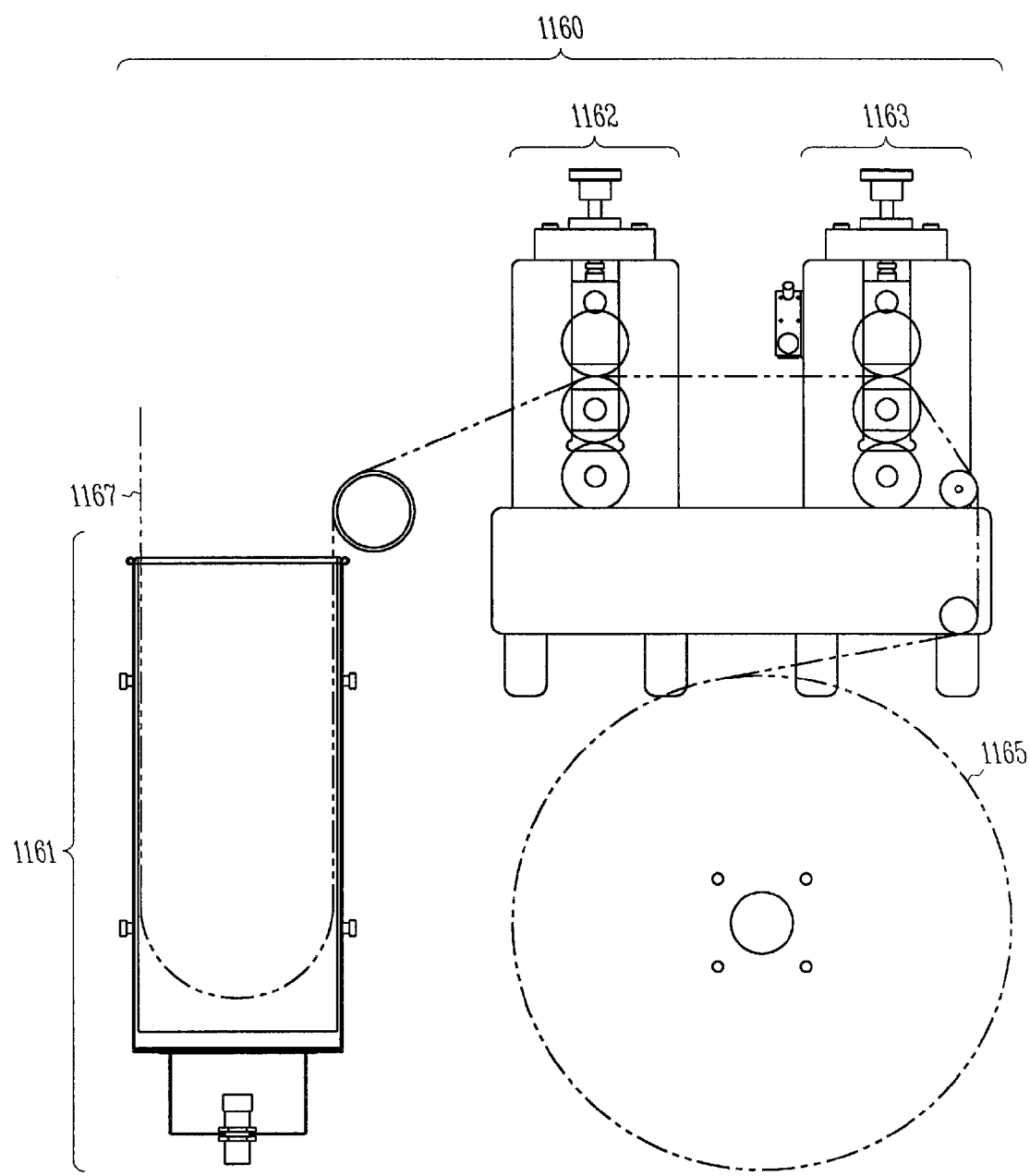
FIG. 11 illustrates an embodiment of a converting apparatus.

FIG. 11 illustrates an embodiment of the post-verification converting apparatus of FIG. 7. In the illustrated embodiment an accumulator regulates movement of the web through the post verification converting apparatus. In various embodiments the accumulator apparatus 1161 is a vacuum box, dancer or festoon. In various embodiments, the post-verification converting apparatus 1160 offers many options for processing of the resultant web 1167 in a plurality of die or nip stations 1162, 1163 represented in FIG. 7 as 762 and 763. In various embodiments, operations such as die perforation, slitting, printing, die cutting, die kiss-cutting, laser cutting, laser printing or combination thereof can be executed. In the illustrated embodiment, the incoming web passes through a set of servo driven nip rolls in two die stations 1162, 1163 and is rewound on a spindle 1165.

Figure 12:
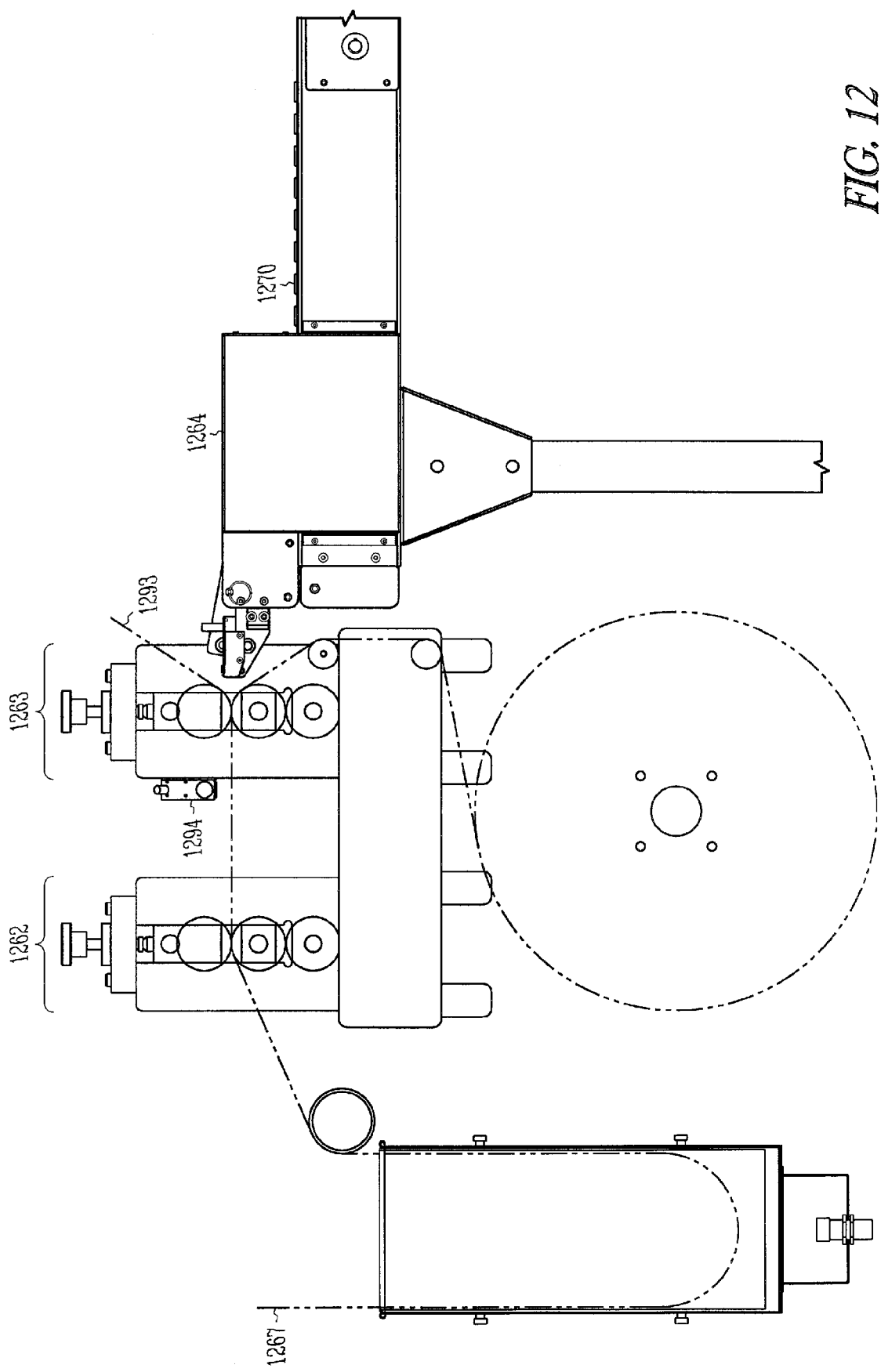
FIG. 12 illustrates an embodiment of a converting apparatus.

FIG. 12 illustrates an embodiment of the post-verification converting apparatus of FIG. 7. In the illustrated embodiment, the incoming web 1267 includes nominally spaced RFID tags. A nip station 1262 controls the movement of the incoming web into a die station 1263. The die station 1263 cuts the web into individual RFID labels. A conveyor apparatus 1264 removes the individual labels 1270 from the die station 1263 for further processing. The illustrated embodiment allows the use of a plurality of dies in the die station 1263, including a sheeting die or a cut-out die. In various embodiments, a sheeting die converts the entire web into individual, labels and tags. In other embodiments, a cut-out die separates only a portion of the web to form the individual labels or tags. The resultant web matrix 1293 is rewound on a spindle. A registration sensor 1294 assists the machine controller in coordinating the position of die cut with respect to the embedded RFID tags or a registration mark located on the web 1267.

Figure 13:
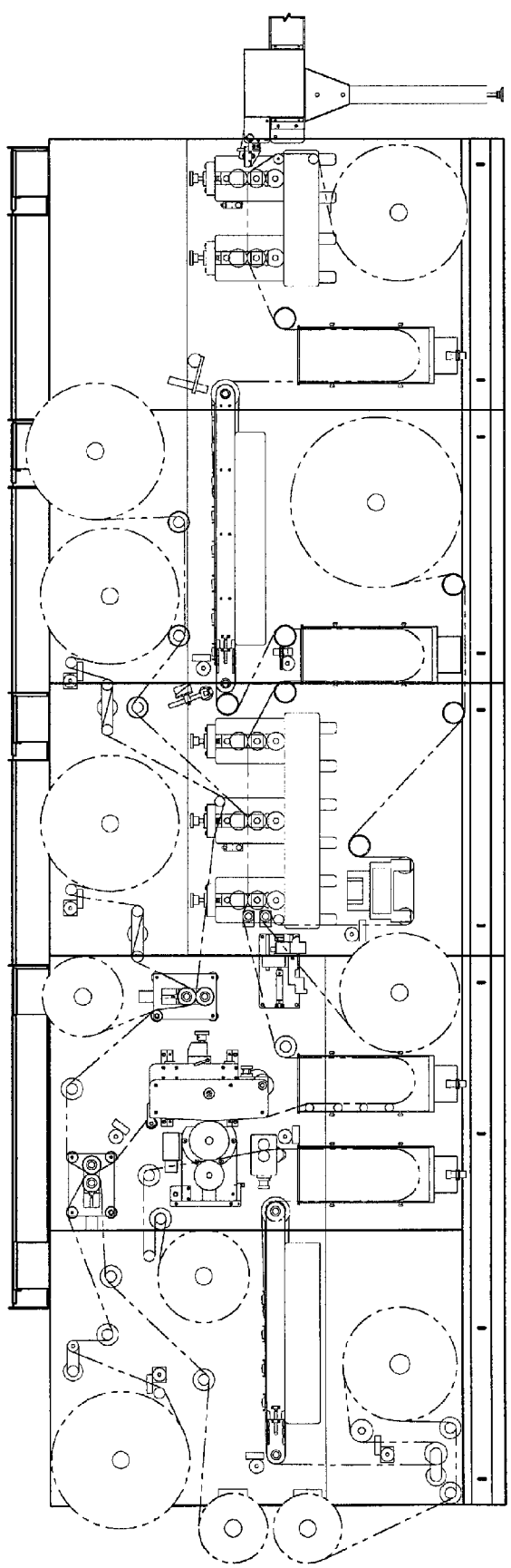
FIG. 13 illustrates an embodiment of a machine for manufacturing RFID labels.

FIG. 13 illustrates a machine embodiment of a RFID converting system. One of ordinary skill in the art will understand, upon reading and comprehending this disclosure, that the various portions of the system illustrated in FIG. 13 correspond to portions of the system illustrated and discussed previously with respect to FIG. 1-12. Specific portions of the system of FIG. 13 are identified and discussed below.

Figure 14:
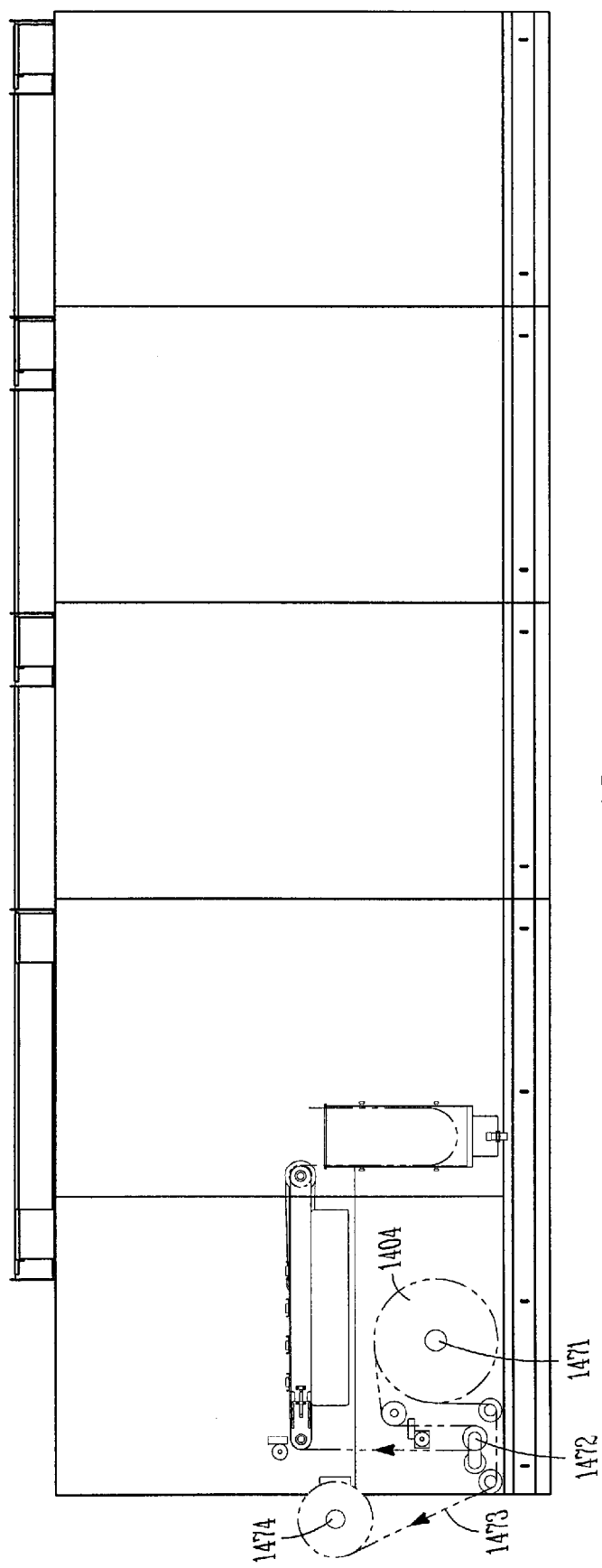
FIG. 14 illustrates an embodiment of the first verification apparatus of FIG. 13.

FIG. 14 shows the pre-placement verification apparatus of the embodiment of FIG. 13. In addition to the embodiments of the components illustrated in FIG. 2, this embodiment illustrates a servo controlled unwind spindle 1471 upon which is mounted the initial stock of RFID tags packaged as a roll of component web 1404. As the component web 1404 of RFID tags is unwound, it passes around the idler of a dancer apparatus 1472. The dancer apparatus 1472 includes a pneumatic cylinder applying a constant tension on the component web. The dancer apparatus 1472 also includes a mounted sensor to provide a position signal to the machine controller. The machine controller regulates the motion of the spindle to keep the dancer centered in its range of travel as the pre-placement verification apparatus moves the component web. The embodiment of FIG. 14 illustrates an optional web 1473 forming part of the initial roll of RFID tags 1404. In the illustrated embodiment the optional web 1473 is pneumatically rewound 1474 at a tension less than the tension applied by the dancer apparatus 1472.

Figure 15:
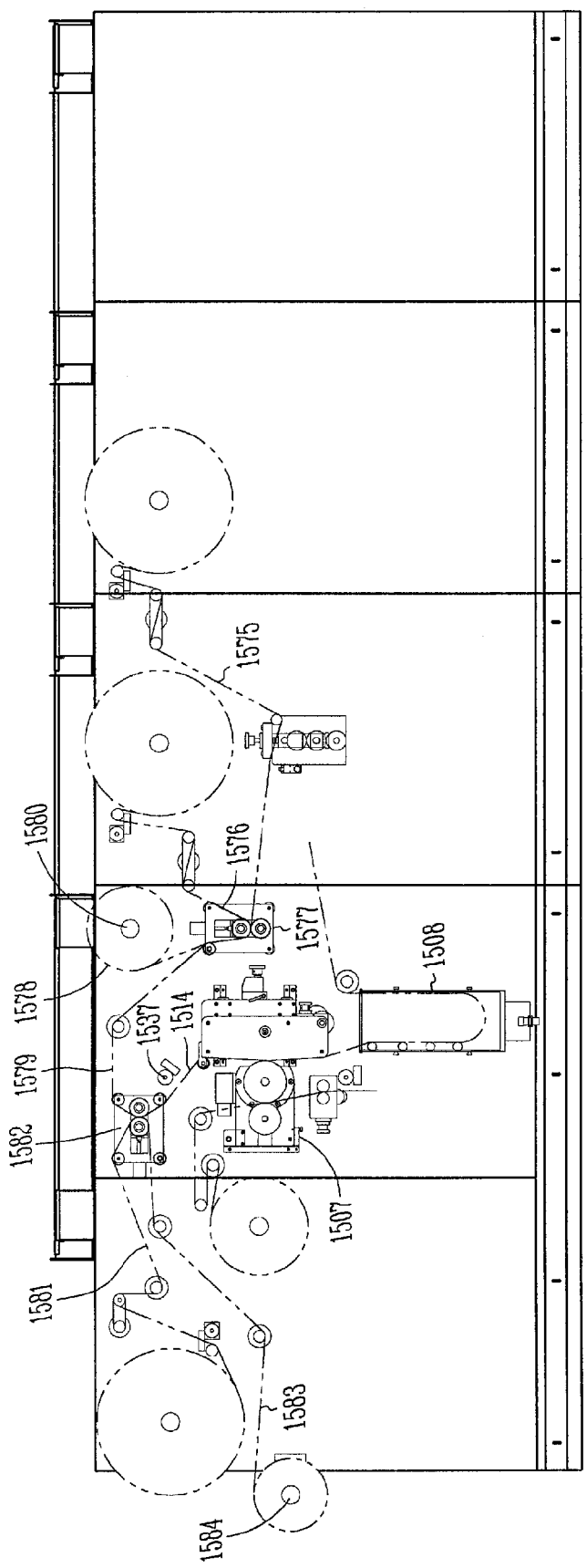
FIG. 15 illustrates an embodiment of the cut, transfer and place apparatus of FIG. 13.

FIG. 15 shows a portion of an embodiment of the cut, place and converter apparatus of FIG. 13. The illustrated embodiment shows the carrier web 1514 may be formed from several webs. In the illustrated embodiment, webs 1575 and 1576 are laminated together in a servo controlled nip station 1577. A liner web 1578 is removed from the surface of the laminated web 1579. The liner is pneumatically rewound on spindle 1580. The laminated web 1579 is laminated to web 1581 in a servo controlled nip station 1582. The laminated web forms the carrier web 1514. A liner web 1583 is removed from the carrier web 1514 to expose an adhesive surface. The liner web 1583 is pneumatically rewound on a spindle 1584. In the illustrated embodiment, the carrier web 1514 is the web to which the RFID devices are transferred and placed by the cut and placement apparatus 1507. In the illustrated embodiment, the carrier web 1514 contains a pre-printed reference mark to which the RFID devices must be placed. Registration sensor 1537 detects the reference mark and the machine controller biases the motion of the placement apparatus to assure each RFID tag is placed with respect to the reference mark. The illustrated embodiment of FIG. 15 includes a vacuum box accumulator 1508 to assist in regulating the motion of down-web apparatus so the machine can operate in an efficient manner.

Figure 16:
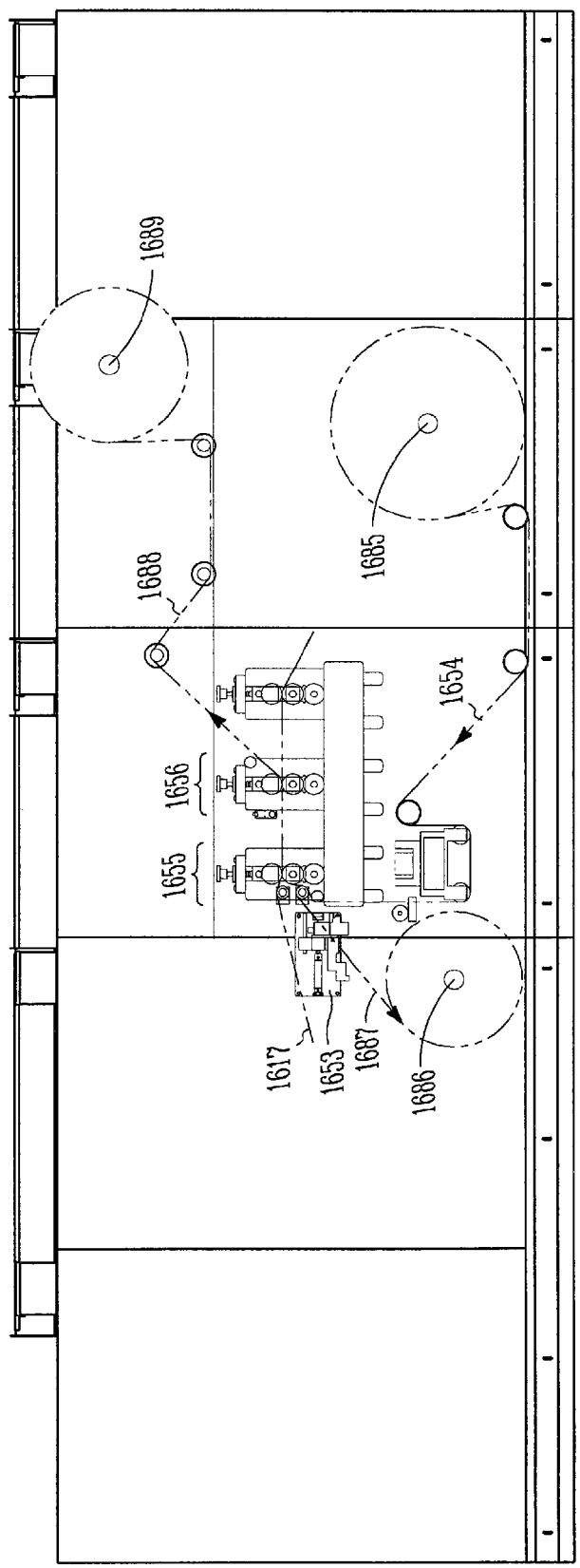
FIG. 16 illustrates an embodiment of the converting apparatus of FIG. 13.

FIG. 16 illustrates an additional portion of an embodiment of the cut, place and converting apparatus of FIG. 13, specifically, the converting apparatus. The intermediate web 1617 entering the converting apparatus includes a carrier web and verified RFID devices placed at regular intervals in the web direction. An adhesive applicator 1653 applies adhesive to the intermediate web 1617 in a pattern to cover the placed RFID tags and the area immediately adjacent to the tags. The primary purpose in applying the material is to present the web to down-web apparatuses with an adhesive covered surface. The applied adhesive material may also protect and physically stabilize the placed RFID tag.

The web 1617 is laminated to a liner web 1654 in a servo driven nip station 1655. The liner material 1654 may be dispensed from one of two spindles, 1685 or 1686. In various embodiments, the liner material 1654 may have an adhesive coating applied to the surface for subsequent lamination. To protect the adhesive layer, a release liner 1687 may be laminated to the liner material 1654. The liner material 1654 is unwound from spindle 1685. Prior to lamination, the release liner 1687 is peeled from the liner material 1654 and rewound on spindle 1686. In the illustrated embodiment, the laminated web is "kiss-cut" in die station 1656. The resulting matrix 1688, including the top layers of carrier web, is rewound on a servo controlled spindle 1689.

Figure 17:
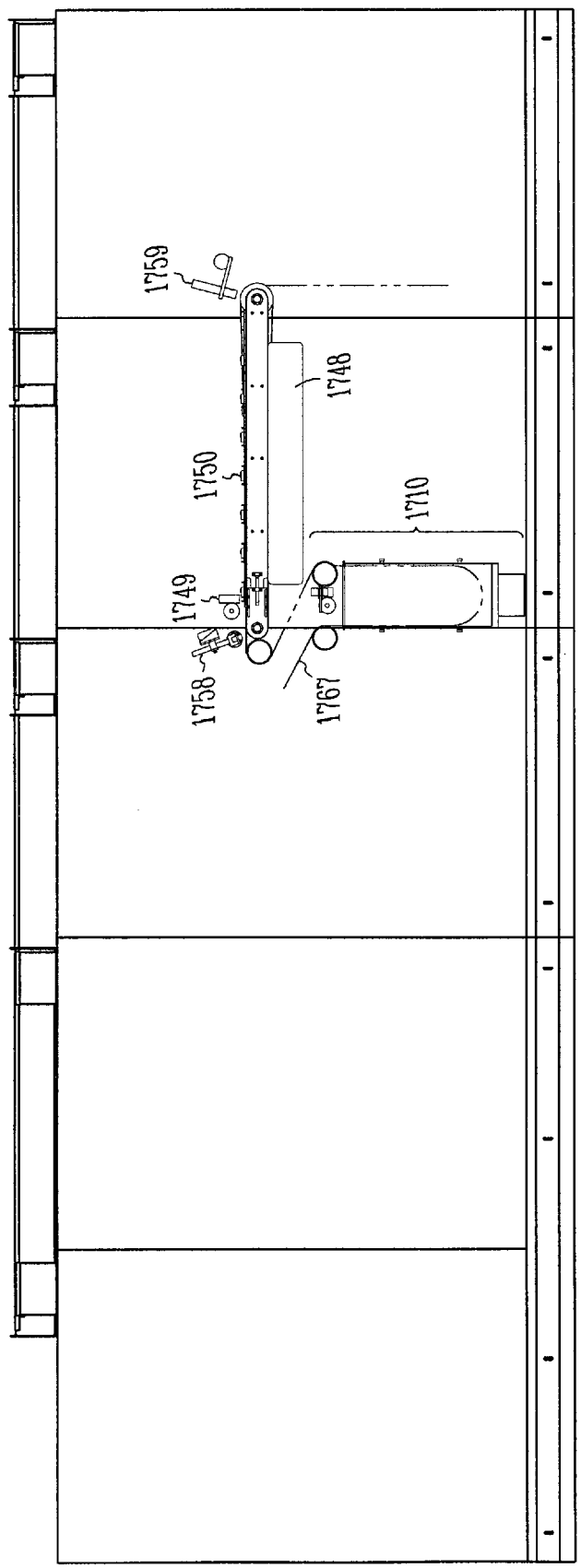
FIG. 17 illustrates an embodiment of the second verification apparatus of FIG. 13.

FIG. 17 shows the embodiment of the post-placement verification apparatus of FIG. 13. This embodiment of FIG. 17 is described above in the embodiment of the post-placement verification apparatus illustrated in FIG. 10. The embodiment of the post-placement verification apparatus of FIG. 17 includes an incoming web 1767, an accumulator 1710, a servo controlled vacuum conveyor 1748, a component sensor 1749, a plurality of RFID readers 1050, a bar code reader 1758 and a marking device 1759.

Figure 18:
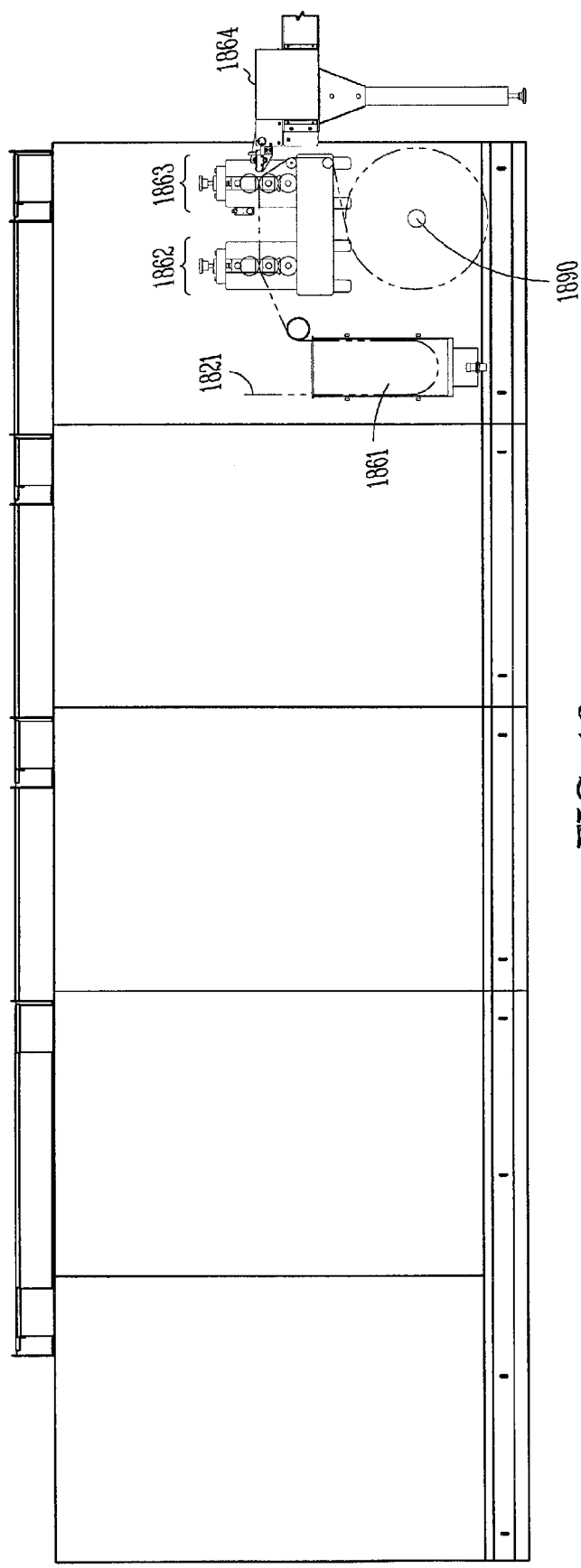
FIG. 18 illustrates an embodiment of the converting area of FIG. 13.

FIG. 18 illustrates an embodiment of the post-verification converting apparatus of FIG. 13. The web 1821 exiting the second verification apparatus is pulled through the vacuum box accumulator 1861 by a pair of nip rolls in the first nip station 1862. In the illustrated embodiment, the web is rewound on spindle 1890. In various embodiments the web is cut into individual RFID labels in a die station 1863 and collected on a conveyor 1864.

Figure 19:
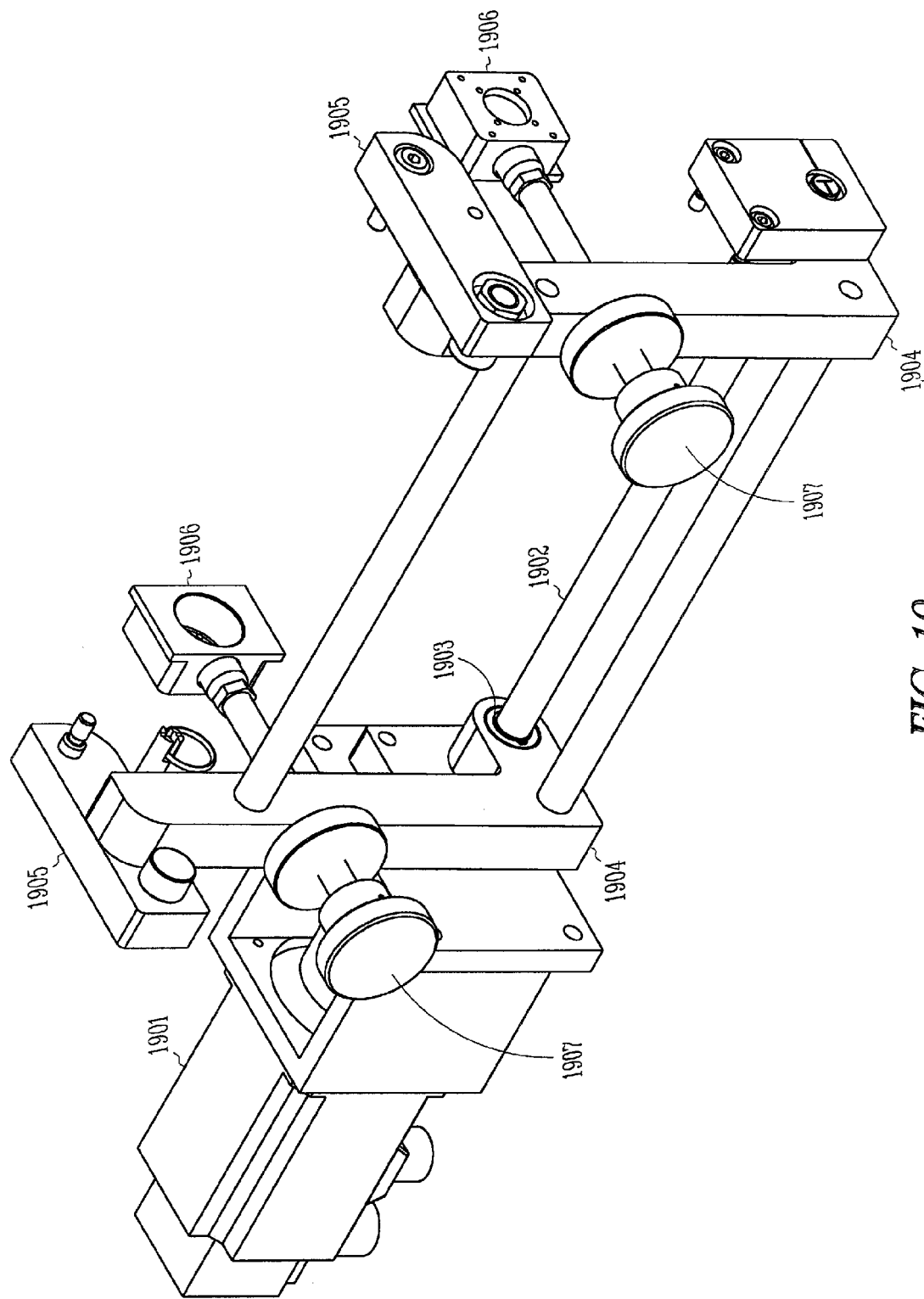
FIG. 19 illustrates an embodiment of the die pressure control apparatus of FIGS. 4 and 5.

FIG. 19 illustrates an embodiment of the die pressure control apparatus described in FIG. 5. Defective RFID tags are prevented from becoming part of a finished RFID label through control of the die pressure control apparatus. A servo motor 1901 is coupled to a shaft 1902. The shaft has two eccentric lobes 1903, mechanically connected through bearings to two major brackets 1904. The major brackets are loosely coupled at one end to two minor brackets 1905 fastened to the endplates of the cut and transfer apparatus. A manual adjustment mechanism 1907 is threaded through each of the major brackets. The manual adjustment mechanisms are operationally interfaced to the die roll bearing blocks 1906. The bearing blocks 1906 slide into the endplates of the cut and transfer apparatus and support the shaft of the die roll. Cutting pressure is applied to the die roll through the bearing blocks 1906.

As the servo motor 1901 turns, the eccentric lobes 1903 produce a circular motion at one end of the major brackets 1904. The loose coupling of the major brackets at the other end, restricts the motion of the loosely coupled end of the major brackets. The resulting motion produces a lever effect pivoting about the loosely connected ends of the major brackets. The lever effect produces a small movement of the major brackets 1904 which is mechanically translated to the die roll bearing blocks 1906 thru the manual adjustment mechanism 1907. When the die roller is positioned next to the vacuum anvil, the small motion increases cutting pressure when directed toward the vacuum anvil, and releases cutting pressure when directed away from the vacuum anvil. The manual adjustment mechanism 1907 allows fine adjustment of the cutting pressure. In various embodiments, springs are used to assist in relieving residual cutting pressure. The springs are positioned so as to exert pressure on the bearing blocks opposite the manual adjustment mechanism when the die roll is assembled in the cut and transfer apparatus.

Figure 20:
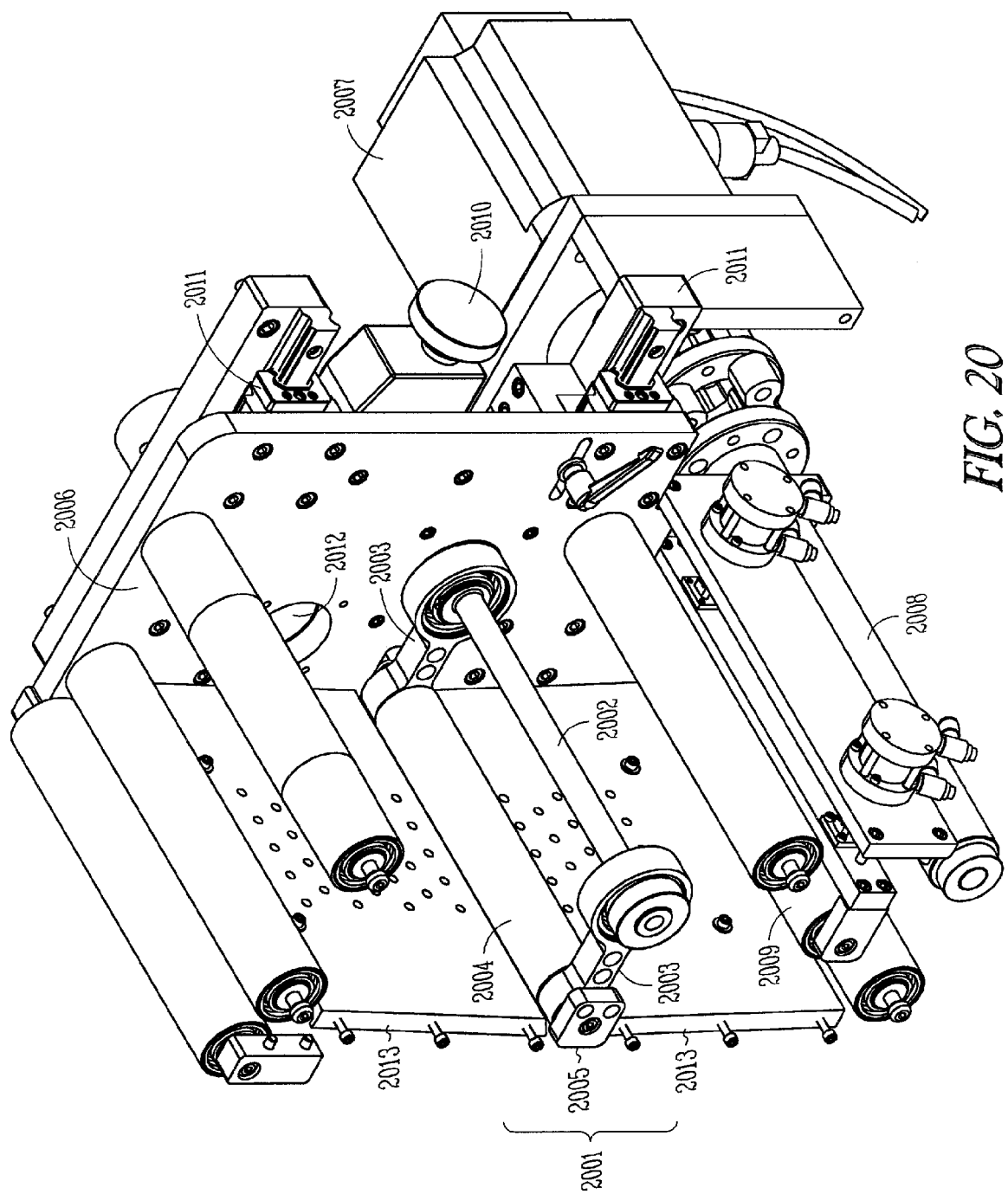
FIG. 20 illustrates an embodiment of the placement apparatus of FIGS. 4 and 5.

FIG. 20 illustrates a cut-away embodiment of the placement apparatus discussed in FIGS. 4 and 5. The cut-away illustrates the placement conveyor apparatus without the conveyor belt and an endplate assembly. The cutaway exposes the bump transfer mechanism 2001. The bump transfer mechanism, as discussed above, pushes the conveyor belt, as well as any web thereon, away from the support plates and toward the vacuum anvil to accomplish a transfer from the vacuum anvil to the web. In the illustrated embodiment, the bump transfer is driven by a servo motor. The bump transfer mechanism servo motor is coupled to a shaft with two eccentric lobes 2002. Each lobe connects thru a bearing to a support bracket 2003, supporting the shaft of a free-rotating bump transfer roll 2004. In the illustrated embodiment, the bump transfer roll shaft is further supported and guided by bearing blocks 2005 supported by the end plates of the placement conveyor 2006. The rotation of the shaft 2002 results in a circular motion of the end of the support brackets 2003. The confined bearing blocks 2005 slideably supporting the bump transfer roll 2004 converts the circular motion of the bracket into translational motion of the bump transfer roll 2004. The free-rotating bump transfer roll 2004 allows operation of the bump transfer mechanism while the servo driven conveyor belt is also moving. The conveyor servo motor 2007 is coupled to a drive roll 2008. The illustrated embodiment shows a pneumatic belt tension roll 2009. A manual adjustment mechanism allows fine adjustment of the placement conveyor location with respect to the vacuum anvil. The mechanism employs a knob 2010 mechanically connected through a threaded shaft to move the conveyor assembly. The conveyor assembly is mounted to the machine through a pair of linear bearings 2011. Movement of the vacuum conveyor along the linear bearings 2011 alters the distance between the placement conveyor and the vacuum anvil. When fully assembled, a vacuum source evacuates air from between the end plates 2006 through a vacuum port 2012. Perforated support plates 2013, as well as a perforated conveyor belt, allow vacuum pressure to adhere web near the surface of the conveyor belt.

The methods illustrated in this disclosure are not intended to be exclusive of other methods within the scope of the present subject matter. Those of ordinary skill in the art will understand, upon reading and comprehending this disclosure, other methods within the scope of the present subject matter. The above-identified embodiments, and portions of the illustrated embodiments, are not necessarily mutually exclusive. These embodiments, or portions thereof, can be combined.

Although specific embodiments have been illustrated and described herein, it will be appreciated by those of ordinary skill in the art that any arrangement which is calculated to achieve the same purpose may be substituted for the specific embodiment shown. This application is intended to cover adaptations or variations of the present subject matter. It is to be understood that the above description is intended to be illustrative, and not restrictive. Combinations of the above embodiments as well as combinations of portions of the above embodiments in other embodiments will be apparent to those of skill in the art upon reviewing the above description. The scope of the present subject matter should be determined with reference to the appended claims, along with the full scope of equivalents to which such claims are entitled.

What is claimed is:

1. A Radio Frequency Identification (RFID) processing system, comprising:
   a machine controller;
   a first verification assembly, the machine controller and the first verification assembly being configured to test a plurality of RFID devices forming at least a portion of a first web, wherein the test includes verifying the operation of each RFID device prior to subsequent processing;
   a first accumulator device to receive the first web from the first verification assembly and to tension and accumulate the first web for subsequent processing;
   a first processing assembly to receive the first web from the first accumulator device, the machine controller and the processing assembly being configured to separate RFID devices forming a portion of the first web and place separated RFID devices onto a second web to form a third web, wherein the third web has a first major surface and a second major surface, wherein the RFID devices are on at least a portion of the second major surface, wherein the first verification apparatus, the first processing assembly and the machine controller are further configured to prevent the placement of defective RFID devices onto the second web;
   a second accumulator device to receive the third web and to tension and accumulate the third web for subsequent processing;
   a converting apparatus to receive the third web from the second accumulation device, the machine controller and the converting apparatus configured to add additional web and process the third web to form a web of RFID labels; and
   a second verification assembly to receive the web of RFID labels, the machine controller and the second verification assembly being configured to test a plurality of RFID devices, wherein the test includes verifying the operation of the RFID devices after the first processing assembly,
   wherein the first processing assembly comprises:
      a vacuum anvil configured to assist die cutting the first web;
      a rotary die, the rotary die being coupled to the vacuum anvil via a first gear mounted to the vacuum anvil and a second gear mounted to the rotary die;
      a die pressure adjustment apparatus wherein the die pressure adjustment apparatus is coupled to the rotary die; and
      a placement apparatus configured to place a plurality of RFID devices from the first web onto the second web to form the third web, wherein the vacuum anvil and the placement apparatus are configured to allow the second web to pass between vacuum anvil and the placement apparatus, and
   wherein the die pressure adjustment apparatus comprises:
      an island placement frame having a first end plate and a second end plate sized to allow the first web to pass between the first end plate and the second end plate;
      a shaft having a first lobe and a second lobe, the shaft being mounted to and extending between the first end plate of the island placement frame and the second end plate of the island placement frame;
      a servo motor coupled to the shaft;
      a first bracket having a first end mechanically connected to the first end plate of the island placement frame, an intermediate portion of the first bracket operationally interfaced to a first bearing block of the rotary die and a second end of the first bracket mechanically connected via a first bearing to the first lobe of the shaft; and
      a second bracket having a first end mechanically connected to the second end plate, a intermediate portion of the second bracket operationally interfaced to a second bearing block of the rotary die and a second end of the second bracket mechanically connected via a second bearing to a second lobe of the shaft.

2. The system of claim 1, wherein the first verification assembly includes:
   a first vacuum conveyor configured to move the first web;
   a first plurality of RFID transceivers configured to verify a plurality of RFID devices forming at least a portion of the first web; and
   a first sensor, the machine controller, the first vacuum conveyor and the first sensor being configured to detect and present each RFID device to at least one of the RFID transceivers.

3. The system of claim 1, wherein the placement apparatus comprises:
   a second vacuum conveyor, the machine controller and the second vacuum conveyor configured to control position and velocity of the second web passing between the second vacuum conveyor and the vacuum anvil; and a bump transfer apparatus configured to move a portion of the second conveyor between a first position and a second position, wherein the portion of the second conveyor is the portion nearest the vacuum anvil and the second position is closer to the vacuum anvil than the first position.

4. The system of claim 3, wherein the second verification apparatus comprises:
a third accumulator apparatus configured to accumulate and dispense the third web;
a third vacuum conveyor configured to move the third web;
a second plurality of RFID transceivers configured to verify the RFID devices comprising at least a portion of the third web; and
a second sensor, the machine controller, the third vacuum conveyor and the second sensor configured to detect and present each RFID device to at least one of the RFID transceivers.

5. A system, comprising:
a machine controller;
a first verification assembly, the machine controller and the first verification assembly being configured to test a plurality of RFID devices forming at least a portion of a first web, wherein the test includes verifying the operation of each RFID device prior to subsequent processing;
a first accumulator device to receive the first web from the first verification assembly and to tension and accumulate the first web for subsequent processing;
a first processing assembly to receive the first web from the first accumulator device, the machine controller and the processing assembly being configured to separate RFID devices forming a portion of the first web and place separated RFID devices onto a second web to form a third web, wherein the third web has a first major surface and a second major surface, wherein the RFID devices are on at least a portion of the second major surface, wherein the first verification apparatus, the first processing assembly and the machine controller are further configured to prevent the placement of defective RFID devices onto the second web;
a second accumulator device to receive the third web and to tension and accumulate the third web for subsequent processing;
a converting apparatus to receive the third web from the second accumulation device, the machine controller and the converting apparatus configured to add additional web and process the third web to form a web of RFID labels; and
a second verification assembly to receive the web of RFID labels, the machine controller and the second verification assembly being configured to test a plurality of RFID devices, wherein the test includes verifying the operation of the RFID devices after the first processing assembly,
wherein the second verification assembly further comprises:
an inspection device, the machine controller and inspection device configured to inspect and read data from a surface of the third web; and
a marking device, the marking device and the machine controller configured mark upon an outer surface of the third web.

6. A system, comprising:
a machine controller;
a first verification assembly, the machine controller and the first verification assembly being configured to test a plurality of RFID devices forming at least a portion of a first web, wherein the test includes verifying the operation of each RFID device prior to subsequent processing;
a first accumulator device to receive the first web from the first verification assembly and to tension and accumulate the first web for subsequent processing;
a first processing assembly to receive the first web from the first accumulator device, the machine controller and the processing assembly being configured to separate RFID devices forming a portion of the first web and place separated RFID devices onto a second web to form a third web, wherein the third web has a first major surface and a second major surface, wherein the RFID devices are on at least a portion of the second major surface, wherein the first verification apparatus, the first processing assembly and the machine controller are further configured to prevent the placement of defective RFID devices onto the second web;
a second accumulator device to receive the third web and to tension and accumulate the third web for subsequent processing;
a converting apparatus to receive the third web from the second accumulation device, the machine controller and the converting apparatus configured to add additional web and process the third web to form a web of RFID labels;
a second verification assembly to receive the web of RFID labels, the machine controller and the second verification assembly being configured to test a plurality of RFID devices, wherein the test includes verifying the operation of the RFID devices after the first processing assembly;
a fourth accumulator to accumulate and dispense the third web; and
a third processing apparatus, wherein the third processing device and the machine controller are to cut the third web into individual RFID articles.

7. A system, comprising:
a machine controller;
a first verification assembly, the machine controller and the first verification assembly being configured to test a plurality of RFID devices forming at least a portion of a first web, wherein the test includes verifying the operation of each RFID device prior to subsequent processing;
a first accumulator device to receive the first web from the first verification assembly and to tension and accumulate the first web for subsequent processing;
a first processing assembly to receive the first web from the first accumulator device, the machine controller and the processing assembly being configured to separate RFID devices forming a portion of the first web and place separated RFID devices onto a second web to form a third web, wherein the third web has a first major surface and a second major surface, wherein the RFID devices are on at least a portion of the second major surface, wherein the first verification apparatus, the first processing assembly and the machine controller are further configured to prevent the placement of defective RFID devices onto the second web;
a second accumulator device to receive the third web and to tension and accumulate the third web for subsequent processing;
a converting apparatus to receive the third web from the second accumulation device, the machine controller and the converting apparatus configured to add additional web and process the third web to form a web of RFID labels; and a second verification assembly to receive the web of RFID labels, the machine controller and the second verification assembly being configured to test a plurality of RFID devices, wherein the test includes verifying the operation of the RFID devices after the first processing assembly;

a fourth accumulator configured to accumulate and dispense the third web; and a third processing apparatus, wherein the third processing device and the machine controller are configured to wind the third web onto a roll of RFID articles.

8. A method of manufacturing Radio Frequency Identification (RFID) labels comprising:

testing a plurality of RFID tags forming at least a portion of a first web to identify defective RFID tags and verified RFID tags;

cutting the first web between a rotary die and an anvil to remove at least the verified RFID tags from the first web;

rotating the anvil to transfer the verified RFID tags cut from the first web away from the first web;

placing the verified RFID tags from the anvil onto a second web to form a third web, wherein the third web has a first major surface;

preventing the defective RFID tags from being placed from the anvil on the second web; and re-testing the RFID tags forming at least a portion of the third web, wherein re-testing the RFID tags includes:

indexing the third web to position at least one RFID tag next to at least one RFID reader;

executing a read operation on each RFID reader, recording the results of the read operation for subsequent processing, wherein a successful read operation indicates a verified RFID tag and a failed read operation indicates a defective RFID tag, writing data to the RFID tag, marking the first major surface of the third web to identify defective RFID tags, marking the first major surface of the third web adjacent verified RFID tags with predetermined data for the verified RFID tags, and reading a pre-printed barcode on the first major surface of the third web while the third web indexes, wherein marking the first major surface of the second web adjacent verified RFID tags includes marking the first major surface of the second web adjacent verified RFID tags with a translated version of the data contained in the barcode.

9. The method of claim 8, wherein testing the RFID tags forming at least a portion of the first web comprises:

moving the first web to present a plurality of untested RFID tags to a plurality of RFID readers;

executing a read operation on each RFID reader, and recording the results of the read operation for subsequent processing, wherein successful read operations identify the verified RFID tags and failed read operations identify the defective RFID tags.

10. The method of claim 8 wherein cutting the first web between a rotary die and an anvil comprises:

selectively actuating a die pressure apparatus to apply a predetermined pressure to cut the verified RFID tags from the first web when presented between the rotary die and the anvil and to not cut the defective RFID tags from the first web when presented between the rotary die and the anvil; and winding a remaining matrix containing the defective RFID tags of the first web.

11. The method of claim 8, wherein cutting the first web includes cutting the first web to remove both the verified RFID tags and the defective RFID tags, rotating the anvil includes transferring both the verified RFID tags cut and the defective RFID tags from the first web away from the first web, and placing comprises:

moving the second web to allow placement of each verified RFID tag at a predetermined distance from a prior placed, verified, RFID tag;

actuating a placement apparatus to move the second web toward the anvil to place each verified RFID tag on the second web;

stopping the second web to account for defective RFID tags; and continuing to transfer each defective RFID tag not placed on the second web to a reject position and releasing the defective RFID tag at the reject position.

12. The method of claim 11, further comprising:

laminating a liner web to the third web opposite the first major surface of the third web;

rotary kiss-cutting the upper surface of the second web around each of the RFID tags; and stripping a matrix of the second web from the laminated liner web.

13. The method of claim 8, further comprising winding the third web.

14. The method of claim 8, further comprising cutting the third web to form individual RFID labels.

15. A system, comprising:

means for testing a plurality of RFID devices on a first web to identify verified RFID devices and defective RFID devices;

means for preparing the first web for subsequent processing after testing the plurality of RFID devices, including means for maintaining tension in the first web and means for accumulating the first web;

means for transferring verified RFID devices from the first web to a second web to form a third web without transferring defective RFID devices from the first web to the second web, wherein the means for transferring verified RFID tags includes a die pressure adjustment apparatus comprising:

an island placement frame having a first end plate and a second end plate sized to allow the first web to pass between the first end plate and the second end plate;

a shaft having a first lobe and a second lobe, the shaft being mounted to and extending between the first end plate of the island placement frame and the second end plate of the island placement frame;

a servo motor coupled to the shaft;

a first bracket having a first end mechanically connected to the first end plate of the island placement frame, an intermediate portion of the first bracket operationally interfaced to a first bearing block of the rotary die and a second end of the first bracket mechanically connected via a first bearing to the first lobe of the shaft; and a second bracket having a first end mechanically connected to the second end plate, a intermediate portion of the second bracket operationally interfaced to a second bearing block of the rotary die and a second end of the second bracket mechanically connected via a second bearing to a second lobe of the shaft;

means for preparing the third web for subsequent processing, including means for maintaining tension in the third web and means for accumulating the third web;

means for transforming the third web with the verified RFID devices into a plurality of RFID labels; and means for testing the plurality of RFID labels, including means for distinguishing between verified RFID labels and defective RFID labels.

16. The system of claim 15, wherein the means for preparing the first web for subsequent processing and the means for preparing the third web with the verified RFID devices for subsequent processing both include a vacuum accumulator.

17. The system of claim 15, wherein the means for transferring verified RFID devices from the first web to a second web without transferring defective RFID devices from the first web to the second web includes a rotary die and an anvil adapted to receive the first web between the die and the anvil.

18. The system of claim 17, wherein the means for transferring verified RFID devices from the first web to a second web without transferring defective RFID devices from the first web to the second web further includes means for automatically adjusting pressure between the die and the anvil to selectively remove the verified RFID devices from the first web without removing the defective RFID devices from the first web.

19. The system of claim 17, wherein the means for transferring verified RFID devices from the first web to a second web without transferring defective RFID devices from the first web to the second web further includes means for transferring verified RFID devices from a surface of the anvil to the second web, and means for transferring defective RFID devices from the surface of the anvil to a reject position.

20. The system of claim 17, wherein the means for transferring verified RFID devices from the first web to a second web without transferring defective RFID devices from the first web to the second web includes means for rotating the anvil to transfer verified RFID devices along a surface of the anvil, and means for selectively moving the second web into contact with verified RFID devices on the surface of the anvil.

21. The system of claim 15, wherein the means for distinguishing between verified RFID labels and defective RFID labels includes means for marking the defective RFID labels.

22. The system of claim 15, wherein the means for transforming the third web with the verified RFID devices into a plurality of RFID labels includes means for providing the verified RFID labels with barcodes.

* * * * *